United States Patent
Kim et al.

(10) Patent No.: US 11,991,878 B2
(45) Date of Patent: *May 21, 2024

(54) SEMICONDUCTOR DEVICE INCLUDING NONVOLATILE MEMORY DEVICE AND LOGIC DEVICE AND MANUFACTURING METHOD OF SEMICONDUCTOR DEVICE INCLUDING NONVOLATILE MEMORY DEVICE AND LOGIC DEVICE

(71) Applicant: SK keyfoundry Inc., Cheongju-si (KR)

(72) Inventors: Kwang Il Kim, Cheongju-si (KR); Yang Beom Kang, Cheongju-si (KR); Jung Hwan Lee, Cheongju-si (KR); Min Kuck Cho, Cheongju-si (KR); Hyun Chul Kim, Chilgok-gun (KR)

(73) Assignee: SK keyfoundry Inc., Cheongju-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/133,693

(22) Filed: Apr. 12, 2023

(65) Prior Publication Data

US 2023/0247830 A1  Aug. 3, 2023

Related U.S. Application Data

(60) Continuation of application No. 17/665,927, filed on Feb. 7, 2022, now Pat. No. 11,665,896, which is a
(Continued)

(30) Foreign Application Priority Data

Jul. 26, 2019  (KR) .................. 10-2019-0090626

(51) Int. Cl.
*H01L 21/00* (2006.01)
*H01L 29/66* (2006.01)
(Continued)

(52) U.S. Cl.
CPC ....... *H10B 41/43* (2023.02); *H01L 29/66825* (2013.01); *H01L 29/788* (2013.01); *H10B 41/10* (2023.02); *H10B 41/44* (2023.02)

(58) Field of Classification Search
CPC ........ H10B 41/43; H10B 41/44; H10B 41/10; H01L 29/66825; H01L 29/788
See application file for complete search history.

(56) References Cited

U.S. PATENT DOCUMENTS

| 4,833,096 A | 5/1989 | Huang et al. |
| 5,153,144 A | 10/1992 | Komori et al. |

(Continued)

FOREIGN PATENT DOCUMENTS

| KR | 10-2004-0042058 A | 5/2004 |
| KR | 10-2005-0095217 A | 9/2005 |

(Continued)

OTHER PUBLICATIONS

Korean Office Action issued on Aug. 23, 2020 in counterpart Korean Patent Application No. 10-2019-0090626 (9 pages in Korean).

*Primary Examiner* — Richard A Booth
(74) *Attorney, Agent, or Firm* — NSIP Law

(57) ABSTRACT

A semiconductor device include a nonvolatile memory device, including a first well region formed in a substrate, a tunneling gate insulator formed on the first well region, a floating gate formed on the tunneling gate insulator, a control gate insulator formed on the substrate, a control gate formed on the control gate insulator, and a first source region and a first drain region formed on opposite sides of the control gate, respectively, and a first logic device, including a first logic well region formed in the substrate, a first logic gate insulator formed on the first logic well region, a first logic gate formed on the first logic gate insulator, wherein the first logic gate comprises substantially a same material as
(Continued)

a material of the control gate of the nonvolatile memory device.

15 Claims, 13 Drawing Sheets

Related U.S. Application Data division of application No. 16/801,266, filed on Feb. 26, 2020, now Pat. No. 11,289,498.

(51) Int. Cl.
*H01L 29/788* (2006.01)
*H10B 41/10* (2023.01)
*H10B 41/43* (2023.01)
*H10B 41/44* (2023.01)

(56) References Cited

U.S. PATENT DOCUMENTS

| | | |
|---|---|---|
| 5,284,784 A | 2/1994 | Manley |
| 5,489,540 A | 2/1996 | Liu et al. |
| 5,907,171 A | 5/1999 | Santin et al. |
| 5,933,729 A | 8/1999 | Chan |
| 6,204,126 B1 | 3/2001 | Hsieh et al. |
| 7,081,381 B2 | 7/2006 | Shum |
| 7,282,410 B2 | 10/2007 | Lu et al. |
| 7,378,315 B2 | 5/2008 | Jeong |
| 7,462,906 B2 | 12/2008 | Lu et al. |
| 7,554,845 B2 | 6/2009 | Cho |
| 7,755,943 B2 | 7/2010 | Shin et al. |
| 7,795,091 B2 | 9/2010 | Winstead et al. |
| 9,257,304 B2 | 2/2016 | Chang et al. |
| 9,275,864 B2 | 3/2016 | Perera et al. |
| 9,553,206 B2 | 1/2017 | Liu |
| 9,824,895 B1 | 11/2017 | Ramkumar |
| 10,032,786 B2 | 7/2018 | Wu et al. |
| 10,504,912 B2 | 12/2019 | Shu et al. |
| 11,665,896 B2 * | 5/2023 | Kim ............... H01L 29/66825 257/314 |
| 2004/0041205 A1 | 5/2004 | Shum |
| 2005/0157549 A1 | 7/2005 | Mokhlesi et al. |
| 2006/0019444 A1 | 1/2006 | Lu et al. |
| 2006/0246659 A1 | 11/2006 | Jeong |
| 2006/0285389 A1 | 12/2006 | Cho |
| 2007/0296022 A1 | 12/2007 | Lu et al. |
| 2008/0054335 A1 | 3/2008 | Jung |
| 2008/0186768 A1 | 8/2008 | Shin et al. |
| 2009/0273013 A1 | 11/2009 | Winstead et al. |
| 2014/0167130 A1 | 6/2014 | Liu |
| 2015/0054044 A1 | 2/2015 | Perera et al. |
| 2015/0235868 A1 | 8/2015 | Chang et al. |
| 2016/0064082 A1 | 3/2016 | Hong et al. |
| 2018/0083019 A1 | 3/2018 | Wu et al. |
| 2019/0035799 A1 | 1/2019 | Shu et al. |

FOREIGN PATENT DOCUMENTS

| | | |
|---|---|---|
| KR | 10-0992746 B1 | 11/2010 |
| KR | 10-2015-0097835 A | 8/2015 |

* cited by examiner

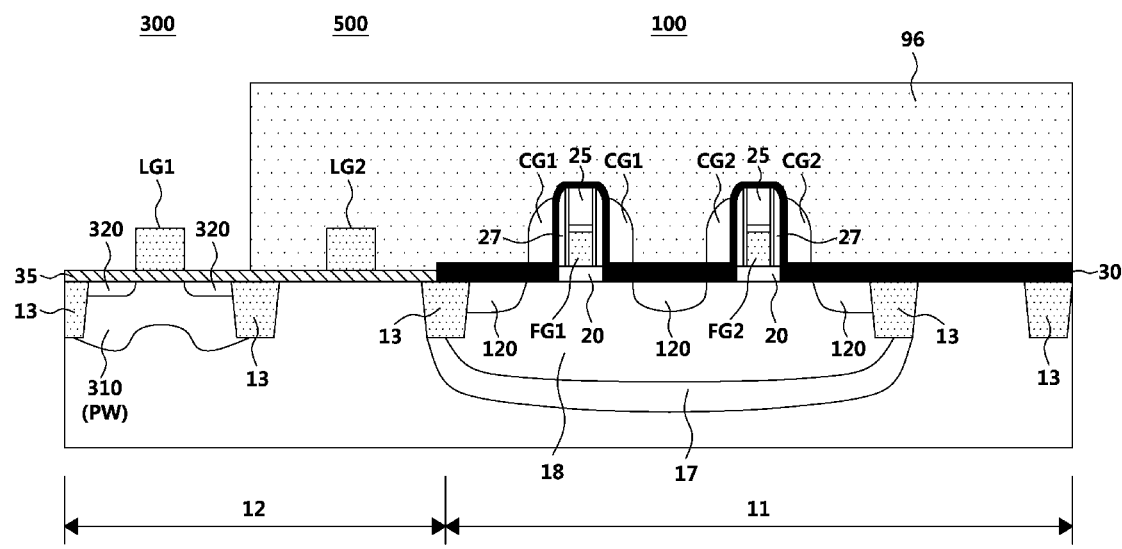
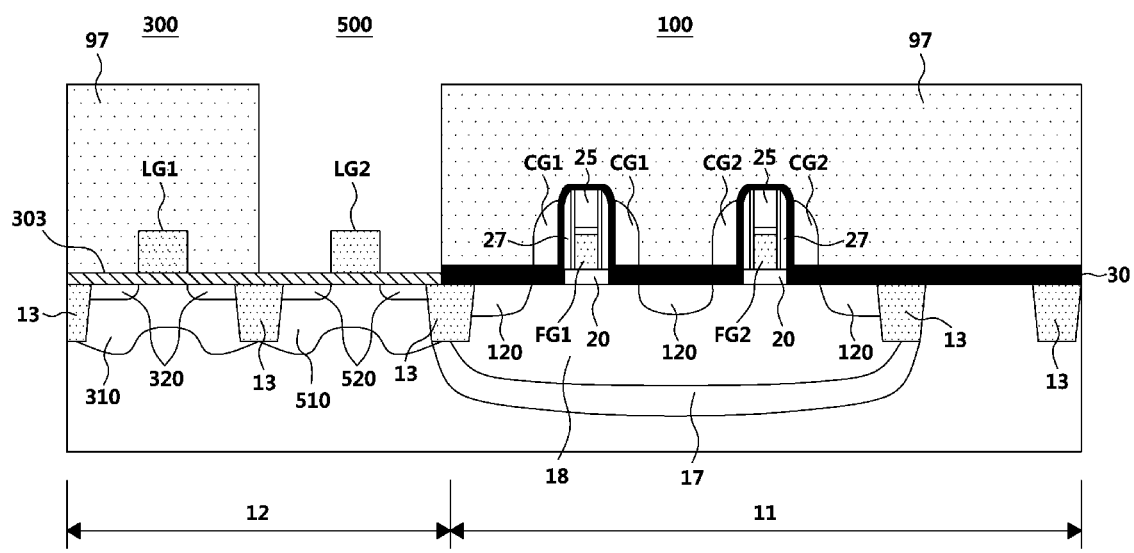

SEMICONDUCTOR DEVICE INCLUDING NONVOLATILE MEMORY DEVICE AND LOGIC DEVICE AND MANUFACTURING METHOD OF SEMICONDUCTOR DEVICE INCLUDING NONVOLATILE MEMORY DEVICE AND LOGIC DEVICE

CROSS-REFERENCE TO RELATED APPLICATIONS

This application is a continuation of U.S. patent application Ser. No. 14/665,927, filed on Feb. 7, 2022, which is a divisional application of U.S. patent application Ser. No. 16/801,266, filed on Feb. 26, 2020, which claims the benefit under 35 USC 119(a) of Korean Patent Application No. 10-2019-0090626 filed on Jul. 26, 2019 in the Korean Intellectual Property Office, the entire disclosure of which is incorporated herein by reference for all purposes.

BACKGROUND

1. Field

The present following description relates to a semiconductor device including a nonvolatile memory device (NVM) and logic device. The following description also relates to a manufacturing method of a semiconductor device including a nonvolatile memory device (NVM) and logic device.

2. Description of Related Art

System on Chip (SOC) techniques have many functional blocks that are integrated in a single chip. Using such techniques, the memory cell array may include a nonvolatile memory (NVM) device, such as, erasable programmable read-only memory (EPROM), electrically erasable programmable read-only memory (EEPROM), one time programmable (OTP) memory, multiple time programmable (MTP) memory, eFuse, and flash memory. Such an EEPROM may be used to store and/or program instructions that may not be electrically erased when power is removed in electronic devices, that is, are persistent. Also, an analog block may include integrated bipolar, complementary metal-oxide-semiconductor (CMOS) and double-diffused MOSFET (DMOS) (BCD), or Bipolar-CMOS-DEMOS devices. In such a technology, the CMOS devices may include logic devices such as low/high voltage NMOS or PMOS devices, control logic, selectors, sense amplifiers, RAM, decoders and DC-DC converters, and may also include a plurality of CMOS transistors. Integration of a BCD device and an NVM device in the single chip may present certain difficulties.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device includes a nonvolatile memory device, including a first well region formed in a substrate, a tunneling gate insulator formed on the first well region, a floating gate formed on the tunneling gate insulator, a control gate insulator formed on the substrate, a control gate formed on the control gate insulator, and a first source region and a first drain region formed on opposite sides of the control gate, respectively, and a first logic device, including a first logic well region formed in the substrate, a first logic gate insulator formed on the first logic well region, a first logic gate formed on the first logic gate insulator, wherein the first logic gate comprises substantially a same material as a material of the control gate of the nonvolatile memory device, and a first logic source region and a first logic drain region formed on opposite sides of the first logic gate, respectively, wherein the first logic well region has a depth shallower with respect to the first logic gate than a depth of the first logic well region with respect to the first logic source region and the first logic drain region.

The semiconductor device may further include a second logic device, including a second logic well region formed in the substrate, a second logic gate insulator formed on the second logic well region, a second logic gate formed on the second logic gate insulator, wherein the second logic gate may include substantially a same material as the material of the control gate of the nonvolatile memory device, and a second logic source region and a second logic drain region formed on opposite sides of the second logic gate, respectively, wherein the second logic well region may have a depth shallower with respect to the second logic gate than a depth of the second logic well region with respect to the second logic source region and the second logic drain region.

The control gate insulator may have a thickness greater than a thickness of the first logic insulator and greater than a thickness of the second logic gate insulator.

The nonvolatile memory device may further include a hard mask pattern formed on the floating gate, a thick dielectric pattern formed between the floating gate and the control gate, control gate spacers formed on sidewalls of the control gate, and a first silicide layer formed on the control gate.

The nonvolatile memory device may further include a deep well region formed below the first well region, wherein the deep well region may have a depth greater than a depth of the first logic well region, and a lightly-doped drain (LDD) region formed in the first well region, wherein the LDD region may have a depth greater than a depth of the first source region and greater than a depth of the first drain region.

The control gate may have a height greater than a height of the first logic gate with respect to a top surface of the substrate.

In another general aspect, a manufacturing method of a semiconductor device includes forming a nonvolatile memory device, including forming a first well region in a substrate, forming a tunneling gate insulator on the first well region, forming a floating gate on the tunneling gate insulator, forming a thick dielectric pattern formed on sidewalls of the floating gate, forming a control gate insulator on the substrate, forming a control gate on the control gate insulator, and forming a first source region and a first drain region on opposite sides of the control gate, respectively, and forming a first logic device, including forming a first logic gate insulator on the substrate, forming a first logic gate on the first logic gate insulator, wherein the first logic gate and the control gate are formed in the same operation, forming a first logic well region by performing a first ion implantation of dopants passing through the first logic gate into the substrate, forming first logic gate spacers formed on sidewalls of the first logic gate, and forming a first logic source region and a first logic drain region on opposite sides of the first logic gate, respectively, wherein the first logic well region has a depth shallower below the first logic gate than a depth of the first logic well region with respect to the first logic source region and the first logic drain region.

The forming a nonvolatile memory device may further include forming control gate spacers on sidewalls of the control gate, and forming a first silicide layer on the control gate.

The forming a nonvolatile memory device may further include forming a deep well region in the substrate, wherein the deep well region may have a depth greater than a depth of the first well region and greater than a depth of the first logic well region, and forming a lightly-doped drain (LDD) region in the first well region, wherein the LDD region may have a depth greater than a depth of the first source region and greater than a depth of the first drain region.

The forming of a floating gate on the tunneling gate insulator may include forming a first conductive film on the tunneling gate insulator, forming a first hard mask pattern on the first conductive film, and performing an etching of the first conductive film using the first hard mask pattern as a mask, thereby forming the floating gate on the tunneling gate insulator, wherein the first hard mask pattern may remain on a top surface of the floating gate.

The forming a control gate on the control gate insulator may include depositing a second conductive film on the control gate insulator and the floating gate, and patterning the second conductive film using an etch-back process, thereby forming the control gate on the control gate insulator and on sidewalls of the thick dielectric pattern, wherein no control gate may be formed on a top surface of the floating gate.

The forming a control gate on the control gate insulator may further include depositing a stacked layer on the second conductive film, patterning the stacked layer, thereby forming a stacked layer pattern on sidewalls of the second conductive film, removing the stacked layer pattern by wet etching using chemical etchants, and implanting dopants into the second conductive film.

The forming the first logic gate on the first logic gate insulator may include forming the logic gate insulator on the substrate, forming a second conductive film on the logic gate insulator, forming a second hard mask pattern on the second conductive film, and patterning the second conductive film, using the second hard mask pattern, to form the first logic gate on the first logic gate insulator.

The control gate may be formed to enclose the floating gate.

In another general aspect, a manufacturing method of a semiconductor device includes preparing a substrate including a cell region and a logic region, wherein a nonvolatile memory device is formed on the cell region and a logic device is formed on the logic region, forming a first well region in the cell region of the substrate, forming a tunneling gate insulator on the first well region, forming a first conductive film on the tunneling gate insulator, patterning the first conductive film, thereby forming a floating gate on the tunneling gate insulator, forming a thick dielectric pattern on sidewalls of the floating gate, forming a control gate insulator on the cell region, forming a first logic gate insulator on the logic region, forming a second conductive film on the logic gate insulator and the control gate insulator, patterning the second conductive film, thereby forming a control gate on the control gate insulator and forming a first logic gate on the first logic gate insulator, such that the first logic gate and the control gate are formed in the same operation, forming a first logic well region by performing a first ion implantation of dopants that pass through the first logic gate into the substrate, forming control gate spacers formed on each sidewall of the control gate and first logic gate spacers on each sidewall of the first logic gate, forming a first source region and a first drain region on opposite sides of the control gate, respectively, and forming a first logic source region and a first logic drain region on opposite sides of the first logic gate, respectively, wherein the first logic well region has a depth shallower below the first logic gate than a depth of the first logic well region with respect to the first logic source region and the first logic drain region.

The patterning the first conductive film may include forming a first hard mask pattern on the first conductive film, and performing an etching of the first conductive film using the first hard mask pattern as a mask, thereby forming the floating gate on the tunneling gate insulator, wherein the first hard mask pattern remains on a top surface of the floating gate.

The patterning the second conductive film may include forming a second hard mask pattern on the second conductive film on the logic region, wherein no second hard mask pattern is formed on the second conductive film on the cell region, and performing an etching process on the second conductive film using the second hard mask pattern as a mask, such that the first logic gate and the control gate may be simultaneously formed on the logic region and the cell region, respectively.

The method may further include forming a deep well region formed in the substrate, wherein the deep well region may enclose the first well region, and forming an LDD region formed in the first well region, wherein the LDD region may enclose the first source region and the first drain region.

The method may further include forming a second logic well region by performing a second ion implantation of dopants passing through the second logic gate into the substrate, forming a second logic source region and a second logic drain region on opposite sides of the second logic gate, respectively, and wherein the second logic well region may have a depth shallower below the second logic gate than a depth of the second logic well region with respect to the second logic source region and the second logic drain region.

In another general aspect, a semiconductor device includes a substrate having a cell region and a logic region, wherein a nonvolatile memory device is formed on the cell region and a logic device is formed on the logic region, a first well region formed in the cell region of the substrate, a tunneling gate insulator formed on the first well region, a first conductive film formed on the tunneling gate insulator, a floating gate formed on the tunneling gate insulator, a thick dielectric pattern formed on sidewalls of the floating gate, a control gate insulator formed on the cell region, a first logic gate insulator formed on the logic region, a second conductive film formed on the logic gate insulator and the control gate insulator, a control gate formed on the control gate insulator, a first logic gate formed on the first logic gate insulator, a first logic well region formed by performing a first ion implantation of dopants passing through the first logic gate into the substrate, control gate spacers formed on each sidewall of the control gate and first logic gate spacers formed on each sidewall of the first logic gate, a first source region and a first drain region formed on opposite sides of the control gate, respectively, and a first logic source region and a first logic drain region formed on opposite sides of the first logic gate, respectively.

The first logic well region may have a depth shallower below the first logic gate than a depth of the first logic well region with respect to the first logic source region and the first logic drain region.

The first logic gate and the control gate may be formed in the same operation.

The semiconductor device may further include a deep well region formed in the substrate, wherein the deep well region may enclose the first well region, and a lightly doped drain (LDD) region formed in the first well region, wherein the LDD region may enclose the first source region and the first drain region.

The semiconductor device may further include a second logic well region formed by performing a second ion implantation of dopants passing through the second logic gate into the substrate, a second logic source region and a second logic drain region on opposite sides of the second logic gate, respectively, and the second logic well region may have a depth shallower below the second logic gate than a depth of the second logic well region with respect to the second logic source region and the second logic drain region.

BRIEF DESCRIPTION OF THE DRAWINGS

FIGS. 10 to 15 illustrate a manufacturing process for forming well regions, LDD regions, source/drain regions and silicide layers in the logic device and the NVM device according to an example.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
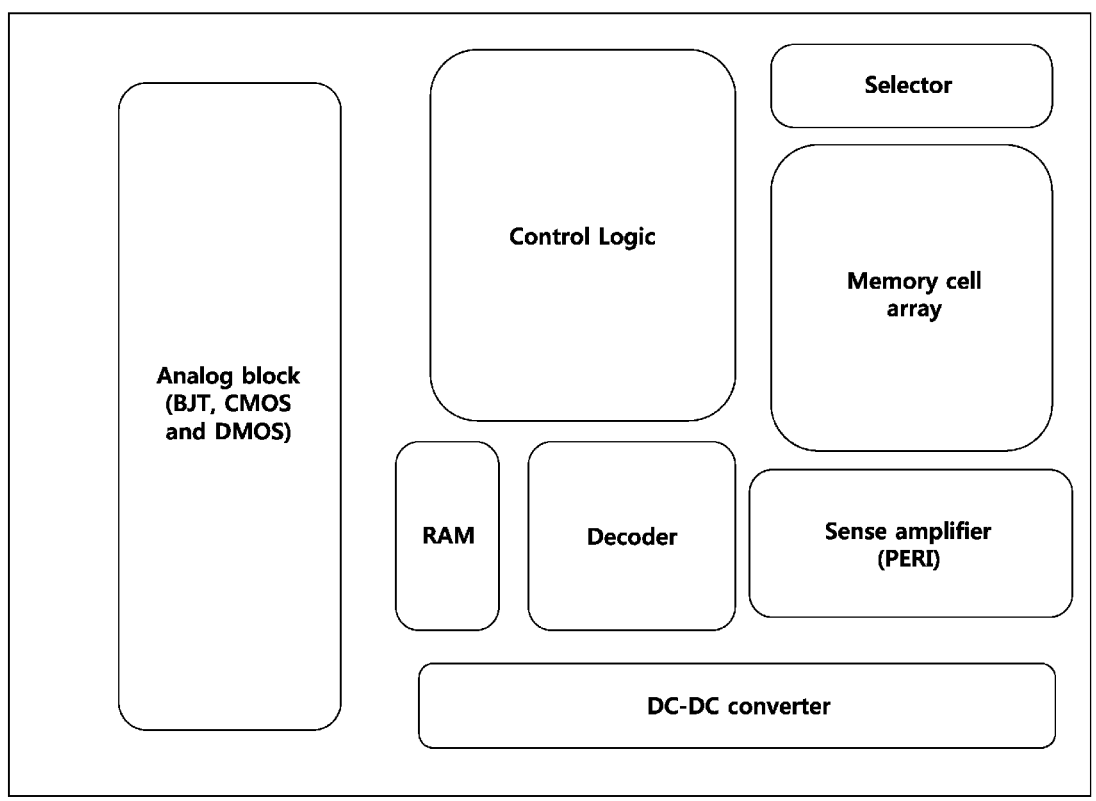
FIG. 1 illustrates a block diagram of a semiconductor device according to an example.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items. For example, the meaning of "a first item, a second item and/or a third item" refers to combinations of all items proposed not only from the first, second, or third item, but also from two or more of the first, second, and third items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

In each step, numerical symbols (for example, a, b, and c) are used for the convenience of description, but do not explain the order of the steps so that unless the context apparently indicates a specific order, the order may be different from the order described in the specification. That is, the steps may be performed in the order as described or simultaneously, or an opposite order.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

Unless they are contrarily defined, all terms used herein including technology or scientific terms have the same meaning as those generally understood by a person with ordinary skill in the art after an understanding of the present disclosure. Terms which are defined in a generally used dictionary should be interpreted to have the same meaning as the meaning in the context of the related art but are not interpreted as an ideally or excessively formal meaning if it is not clearly defined otherwise in the present disclosure.

The BCD device with NVM device has become increasingly important in applications of automotive, wireless charger, moto driver integrated circuit (IC), and so on. Herein, a technology for fabricating BCD devices with NVM devices can be called as BCDN technology or BCDN process. In the BCDN technology or BCDN process, the EEPROM and logic device are embedded into a single chip, which requires many process steps with number of masks. Simultaneously forming the EEPROM and logic device in the single chip is very complex due to a structural difference between the EEPROM and logic device.

To fabricate a logic device, several photo lithography masks are required for a formation of a NMOS gate electrode, and a PMOS gate electrode as well as high voltage N-type deep well region (HNW), high voltage P-type deep well region (HPW), logic N-type well region (NW), logic P-type well region (PW), N-type LDD region (NM), P-type LDD region (PM), source regions and drain regions, and so on.

Further, to fabricate the NVM device, such as an EEPROM, it also requires several photo lithography masks for formation of a tunneling gate insulator, a floating gate, a control gate insulator, an ONO dielectric layer, hard mask patterns and a control gate, and so on.

To reduce a cost of manufacturing fabrication, an effort is helpful to reduce the number of masks which are used for the fabrication of EEPROM and logic device. The integration of the EEPROM and logic device in the single chip or integrated circuit (IC) may be challenging and becomes even more problematic when making real-world attempts to do so.

An object of the present examples is to provide a semiconductor device including a nonvolatile memory device with logic device that may be manufactured using a small number of photo mask processes and a manufacturing method of the same.

According to the nonvolatile memory device and a manufacturing method of the same, according to an example, the semiconductor device including a logic device and an NVM device in a single chip may be formed with a reduced number of photo mask processes. Further, the processing steps may be reduced so that it is expected to reduce the cost for manufacturing the semiconductor device.

FIG. 1 illustrates a block diagram of a semiconductor device according to an example.

The semiconductor device may have many functional blocks, such as an analog block, a control logic block, a memory cell array block, a random access memory (RAM) block, a decoder block, a DC-DC converter block, a sense amplifier block, a selector block, and so on. The functional blocks may be integrated in a single chip 50. The memory cell array may also have a non-volatile memory (NVM) device, such as an EEPROM, a flash memory, an EPROM, a Mask ROM, and so on, where the NVM device stores data even when not actively powered on. The memory cell array may be divided into a main cell region and a peripheral circuit region. The main cell region may also have a plurality of NVM unit cells, for example, a plurality of EEPROM unit cells. The peripheral circuit region may include logic transistors or logic devices. The control logic block, analog block, the sense amplifier block, the DC-DC converter block, the decoder block, the RAM, and the selector block may also contain other logic transistors or other logic devices or BCD devices. The present examples show a manufacturing method in which the logic devices or BCD devices are simultaneously fabricated on a single chip 50.

Figure 2:
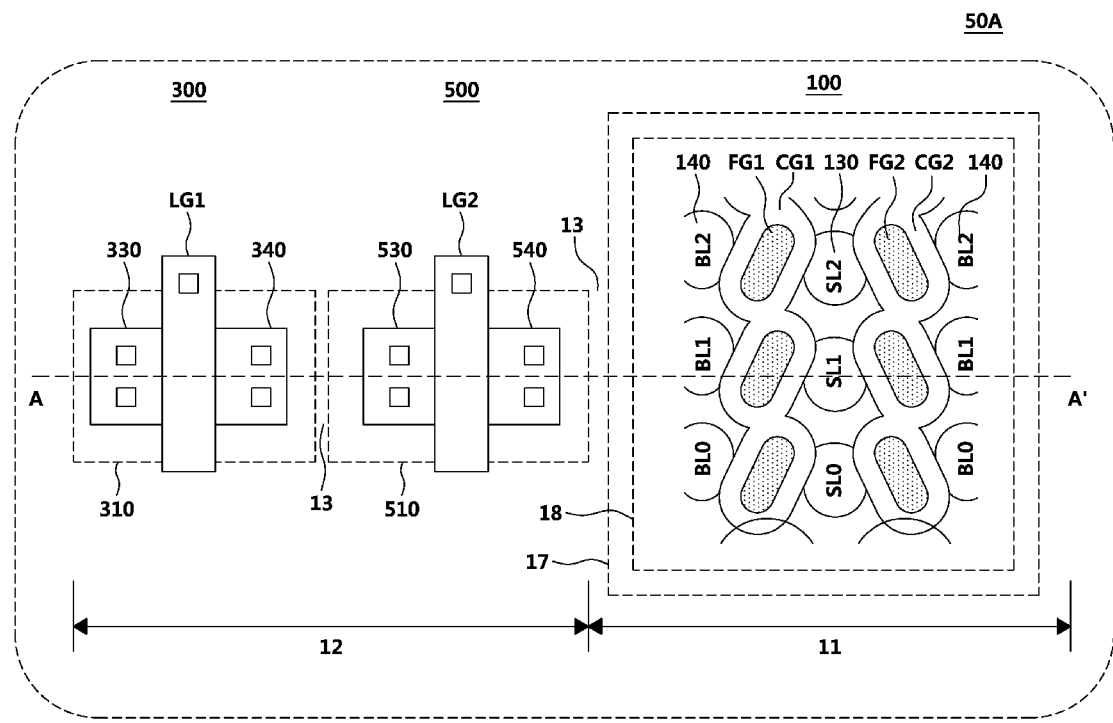
FIG. 2 illustrates a top view of a semiconductor device including an NVM and a logic device according to an example.

FIG. 2 illustrates a top view of a semiconductor device including an NVM and a logic device, according to an example.

Referring to the example of FIG. 2, a semiconductor device or integrated circuit (IC) 50A may include, at least, a nonvolatile memory (NVM) device 100 and a logic device or BCD device 300 and 500. As shown in the example of FIG. 1, the NVM device 100 may exist in the memory cell array of the semiconductor device or integrated circuit 50A. The logic device or BCD device 300 and 500 may exist in the region including the control logic block, the analog block, the sense amplifier, the DC-DC the converter, the decoder, the RAM, the selector, and so on. In such an example, the NVM device 100 may comprise an EEPROM, an EPROM, a flash memory, an OTP or an MTP, and so on. The logic device or BCD device 300 and 500 may be, for example, a metal-oxide-semiconductor (MOS) device, a DMOS device, a bipolar junction transistor (BJT), or some other suitable logic or BCD device. For example, the MOS or DMOS devices may include a low voltage device as well as a high voltage device or a medium voltage device. For example, the MOS devices may also include an NMOS device or an NMOS transistor 300 and a PMOS device or a PMOS transistor 500.

The NVM device 100 may be formed on a cell region 11. The cell region 11 may have a plurality of unit cells such that a word line, a bit line and a source line are formed for programming, writing, erasing and reading operations. The cell region 11 may have repeated EEPROM unit cells. The cell region 11 may also be referred to as a memory cell array. The logic device or BCD device 300 and 500 may be formed on a logic region or BCD region 12. In some examples, the logic region or BCD region 12 may be located at a logic region of the IC and/or at a periphery of the IC and/or at a periphery of the cell region 11. Further, the logic or BCD device 300 and 500 may overlie a logic well region or a BCD well region 310 and 510 in the logic region or the BCD region 12.

Referring to the example of FIG. 2, the NVM device 100 may include first and second floating gates FG1 and FG2 and control gates CG1 and CG2, as well as NVM well regions 17 and 18. The first and second floating gates FG1 and FG2 may be enclosed by the first and second control gates CG1 and CG2, respectively. The NVM device 100 may further include source regions 130 and drain regions 140 to interconnect source lines SL0, SL1, SL2 and bit lines BL0, BL1, BL2, respectively. Further, the logic device 300 and 500 may include the logic gates LG1 and LG2 and source/drain regions 330, 340, 530 and 540, as well as logic well regions 310 and 510. Each device may be isolated even though adjacent to another device by the presence of isolation region 13. For example, an active region may be enclosed by the isolation region.

Figure 3:
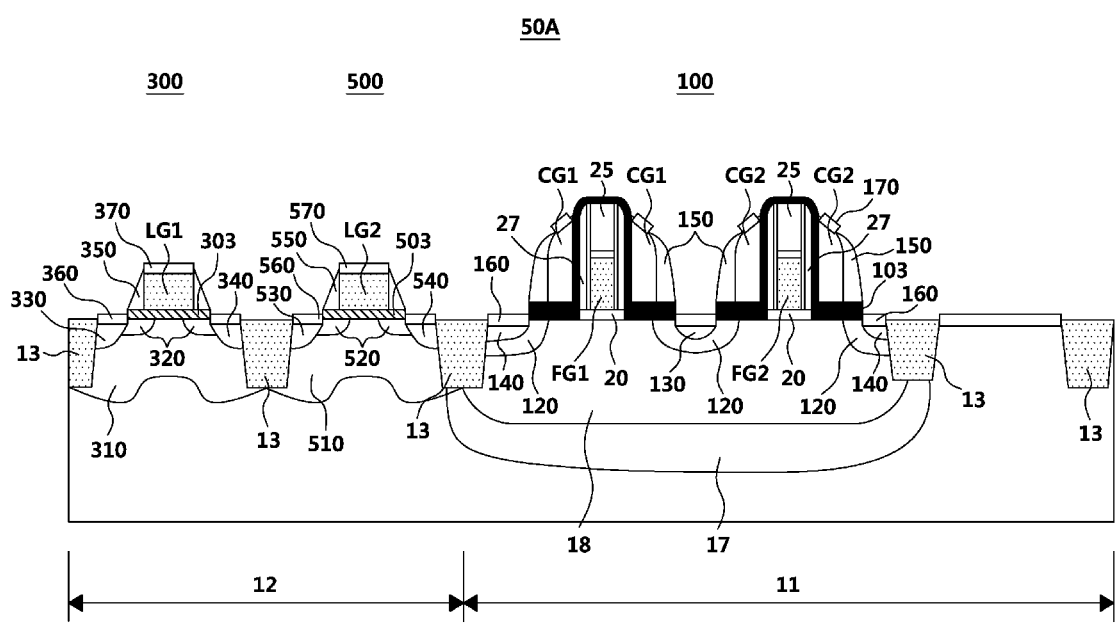
FIG. 3 illustrates a cross-sectional view along A-A' line in FIG. 2 of a semiconductor device including an NVM and logic device according to an example.

FIG. 3 shows a cross-sectional view along A-A' line in the example of FIG. 2 of a semiconductor device including an NVM and logic device, according to an example.

Referring to the example of FIG. 3, the NVM device 100 may include a deep N-type well (DNW) region 17 formed in the cell region 11 and a P-type well (HPW) region (first well region) 18 formed on the DNW region 17. Accordingly, the DNW region 17 may enclose the HPW region or first well region 18 to isolate the HPW region from the substrate 10. The NVM device 100 further includes three N-type LDD (HNM) regions 120 formed in the HPW region 18 and a common source region 130 formed in one of the HNM region 120 and drain regions 140 formed in the other two HNM regions 120. In such an example, the common source region 130 may be formed between the first floating gate FG1 and the second floating gate FG2.

Referring to the example of FIG. 3, the NVM device 100 may further include a tunneling gate insulator 20 and a control gate insulator 30 formed on the substrate 10, first and second floating gates FG1 and FG2 formed on the tunneling gate insulator 20, a first hard mask pattern 25 formed on a top surface of the first and second floating gates FG1 and FG2, a thick dielectric pattern or ONO dielectric layer 27 formed on sidewalls of the first and second floating gates FG1 and FG2, and first and second control gates CG1 and CG2 formed on the control gate insulator 30. The thick dielectric pattern 27 may be disposed between the floating gate FG1 or the floating gate FG2 and the control gate CG1 or the control gate CG2. Thus, each of the control gates may be insulated from each of the floating gates FG1 and FG2 by the thick dielectric pattern 27. In such an example, the ONO dielectric layer or thick dielectric pattern 27 refers to an oxide (O)/nitride (N)/oxide (O) stacked film.

Referring to the example of FIG. 3, the NVM device 100 may further include control gate sidewall spacers 150 formed on the sidewalls of the control gates, silicide layers 160 formed on a top surface of the substrate 10 or on the source and drain regions 140 and 130, and silicide layers 170 formed on a top surface of the control gates.

In the NVM device 100, the tunneling gate insulator 20 and the control gate insulator 30 may be formed by thermal oxidation. The tunneling gate insulator 20 may have a thickness thinner than a thickness of the control gate insulator 30. The first and second floating gates FG1 and FG2 and the first and second control gates CG1 and CG2 may include polysilicon material. Also, the first and second floating gates FG1 and FG2 and the first and second control gates CG1 and CG2 may be formed by a low pressure chemical vapor deposition (LPCVD) method. The first and second control gates CG1 and CG2 may include metal layers, such as tungsten (W) or tantalum (Ta) or titanium nitride (TiN) in order to decrease the resistivity of the gate electrode. The first hard mask pattern 25 may include a stacked film structure, such as a structure including a nitride film formed on an oxide film, that is, SiN/SiO2. The first hard mask pattern 25 may be used as a mask for the patterning of the first and second floating gates FG1 and FG2.

The thick dielectric pattern 27 may be disposed between the first and second floating gates FG1 and FG2 and the first and second control gates CG1 and CG2. Thus, the sidewalls of the first and second floating gates FG1 and FG2 may be enclosed by the thick dielectric pattern 27, and a top surface of the first and second floating gates FG1 and FG2 may be in direct contact with the hard mask pattern 25. Accordingly, the first and second floating gates FG1 and FG2 are fully enclosed by insulating layers, such as the thick dielectric pattern 27 and the first hard mask pattern 25.

The control gate insulator 30 may be used as a gate dielectric layer for the first and second control gates CG1 and CG2. The control gate insulator 30 may include a thermal oxide film, such as either one or both of an SiO2 film and an SiON film, as non-limiting examples. The thermal oxide film may have minimized interface defects at the interface between the gate electrode and the substrate, which may result in a relatively low leakage current. The thermal oxide film, formed of SiO2 in a non-limiting example, also may have a high band gap characteristic and may minimize the generation of hot electrons. In one example, a high-k material such as Hafnium Oxide ($HfO_2$), Aluminum Oxide ($Al_2O_3$), Tantalum Oxide ($Ta_2O_5$), and so on, as non-limiting examples, may be used for the control gate insulator 30. When such a high-k material is used, a capacitance may be increased and a coupling efficiency may be maximized.

Each of the first and second floating gates FG1 and FG2 may be disposed on a top surface of the substrate 10 in the cell region 11 and may be enclosed by each of the first and second control gates CG1 and CG2. In one example, the first floating gate FG1 may be disposed between portions of the first control gate CG1. In a similar manner, the second floating gate FG2 may be disposed between portions of the second control gate CG2. Also, the first and second floating gates FG1 and FG2 may be connected to a word line.

The first and second control gates CG1 and CG2 may be disposed on the control gate insulator 30 formed on a top surface of the substrate 10 in the cell region 11 in order to enclose the first and second floating gates FG1 and FG2, respectively. The first and second control gates CG1 and CG2 may enclose all the floating gates FG1 while having the same height. Depending on the manufacturing process, the first and second control gates CG1 and CG2 may have a different height from that of the logic gates LG1 and LG2. For example, the first and second control gates CG1 and CG2 may have a height higher than a height of the logic gates LG1 and LG2.

Referring to the example of FIG. 3, the logic devices 300 and 500 may include an NMOS device and a PMOS device. In such an example the NMOS device 300 may include a first logic P-type well (PW) region 310 formed in the logic region 12, N-type LDD (NLDD) regions 320 formed in the first logic PW region 310, a first logic N-type source region 330 and a first logic N-type drain region 340 formed in the first logic PW region 310, a first logic gate insulator 301 formed on the substrate 10, a first logic gate LG1 formed on the first logic gate insulator 301, first logic gate spacers 350 formed on sidewalls of the first logic gate LG1, silicide layers 360 formed on the N-type source and N-type drain regions 330 and 340, and silicide layers 370 formed on a top surface of the first logic gate LG1.

Referring to the example of FIG. 3, the PMOS device 500 may include a second logic N-type well (NW) region 510 formed in the logic region 12, P-type LDD (PLDD) regions 520 formed in the second logic NW region 510, a second logic P-type source region 530 and a second logic P-type drain region 540 formed in the second logic NW region 510, a second logic gate insulator 501 formed on the substrate 10; a second logic gate LG2 formed on the second logic gate insulator 501, second logic gate spacers 550 formed on sidewalls of the second logic gate LG2, silicide layers 560 formed on the P-type source and P-type drain regions 530 and 540, and silicide layers 570 formed on a top surface of the second logic gate LG2.

A depth of the first logic PW region 310 below the first logic gate LG1 may be shallower than a depth of the first logic PW region 310 below the first logic N-type source region 330 and the first logic N-type drain region 340. A depth of the first logic PW region 310 below the first gate electrode may also be shallower than a depth of the first logic PW region 310 below the isolation region 13. In the same manner, a depth of the second logic NW region 510 below the second logic gate LG2 may be shallower than a depth of the second logic NW region 510 below the second logic P-type source region 530 and below the second logic P-type drain region 540. A depth of the second logic NW region 510 below the second logic gate LG2 may be shallower than a depth of the second logic NW region 510 below the isolation region 13.

The different depth as mentioned above may be due to the ion implantation processes for the first logic PW region 310 and the second logic NW region 510 being performed after formation of the gate electrodes LG1 and LG2. Dopants may pass through the first logic gate LG1 and the second logic gate LG2 when the ion implantation processes is performed. However, the formation of the DNW region 17 and the HPW region 18 is performed before formation of the floating gate electrode FG1 and FG2. Therefore, the depth profiles of the DNW region 17 and the HPW region 18 may be different from those of the PW and NW regions 310 and 510. Accordingly, the depth profiles of the DNW region 17 and the HPW region 18 below the floating gate electrode FG1 and FG2 may be deeper than a depth profile of the DNW region 17 and the HPW region 18 below the source/drain regions 130/140.

FIGS. 4A to 5B illustrate a manufacturing process of a floating gate in a semiconductor device according to an example.

Figure 4A:
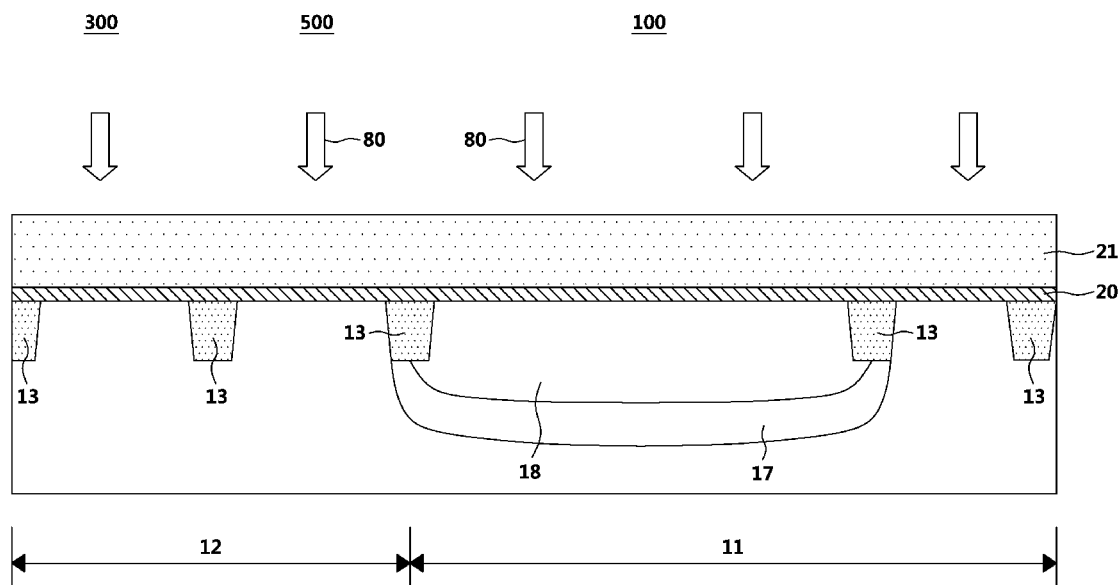
FIGS. 4A to 5B illustrate a manufacturing process of a floating gate in a semiconductor device according to an example.

Referring to the example of FIG. 4A, in the NVM device 100, isolation regions 13 may be formed in the substrate 10. A deep N-type well (DNW) region 17 may be formed in the cell region 11 of the substrate 10. A P-type well (HPW) region or first well region 18 is formed on the DNW region 17. In such a manner, the DNW region 17 may enclose the HPW region or first well region 18 in order to isolate the HPW region from the substrate 10.

Referring to the example of FIG. 4A, a tunneling gate insulator 20 may be formed on an entire surface of the logic region 12 and the cell region 11 of the substrate 10. In this example, the tunneling gate insulator 20 may be formed by any one of a silicon oxide film $SiO_2$, a silicon nitride film SiN, and a silicon oxynitride film SiON, or a stack of such film materials, as non-limiting examples. A first conductive film 21 may be deposited on the tunneling gate insulator 20. The first conductive film 21 may be formed as a single polysilicon layer or as a stacked metal/polysilicon layer in which a metal layer is laminated on polysilicon. Then, N-type dopants 80 may be implanted into the first conductive film 21 to distribute the N-type dopants 80 into the first conductive film 21. After ion implantation 80, an annealing process may be performed to activate the N-type dopants distributed in the first conductive film 21, resulting in an N-type conductivity first conductive film 21 being formed.

Figure 4B:
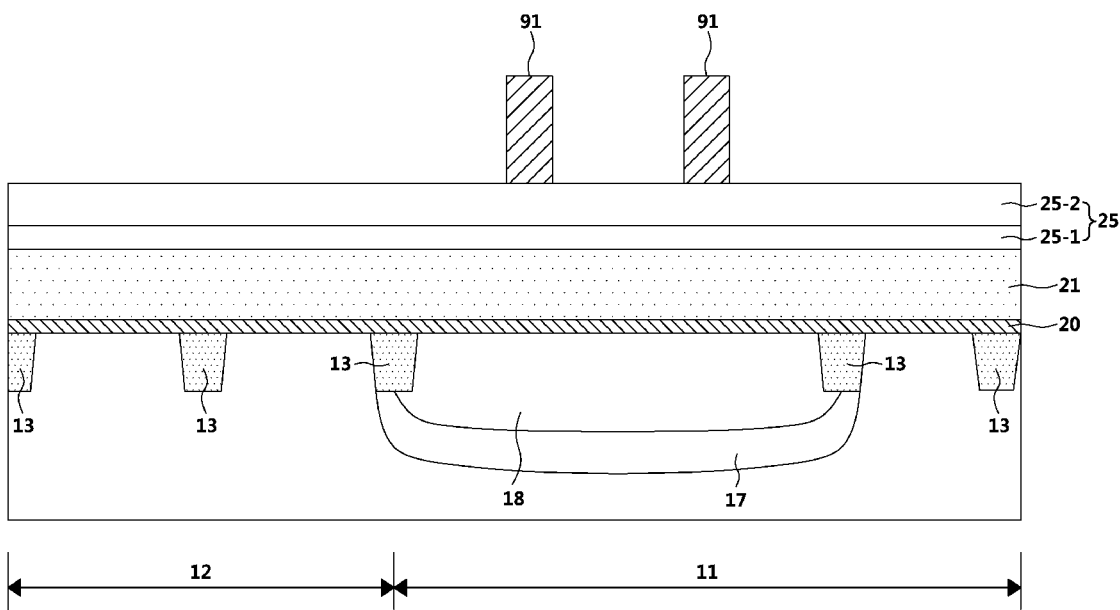

Referring to the example of FIG. 4B, a first insulating layer 25-1 and a second insulating layer 25-2 may be deposited on the first conductive film 21 by the LPCVD method, and then a PR mask pattern 91 may be formed on the second insulating layer 25-2 to pattern the first insulating layer 25-1 and the second insulating layer 25-2. The first insulating layer 25-1 may include a silicon oxide layer. The second insulating layer 25-2 may include a silicon nitride layer. Additionally, a plasma etching process may be performed on the first insulating layer 25-1 and the second insulating layer 25-2 in order to form a first hard mask pattern 25 by using the PR mask pattern 91 as a mask.

Figure 4C:
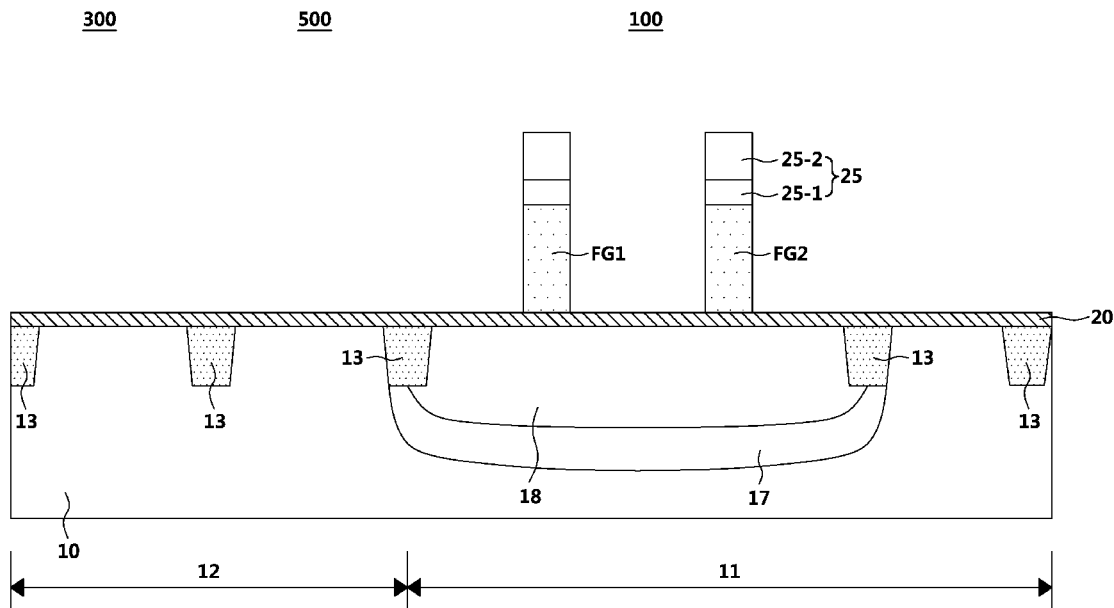

Referring to the example of FIG. 4C, a further plasma etching process is performed on the first conductive film 21 in order to form a first floating gate FG1 and a second floating gate FG2 by using the first hard mask pattern 25 as an etching mask. In such an example, a first hard mask pattern 25 may be formed above the first and second floating gates FG1 and FG2 to protect the first and second floating gates FG1 and FG2 during the subsequent etching process. The first hard mask pattern 25 may include a stacked film that combines the silicon oxide film 25-1 and the silicon nitride film 25-2. Furthermore, in such an example, the PR mask pattern 91 may be consumed and may disappear during the plasma etching processes mentioned above. In the cell region 11, the tunneling gate insulator 20 and the first and second floating gates FG1 and FG2 may be formed, but in the logic region 12, the first conductive film 21 may be removed by the plasma etching process.

Figure 5A:
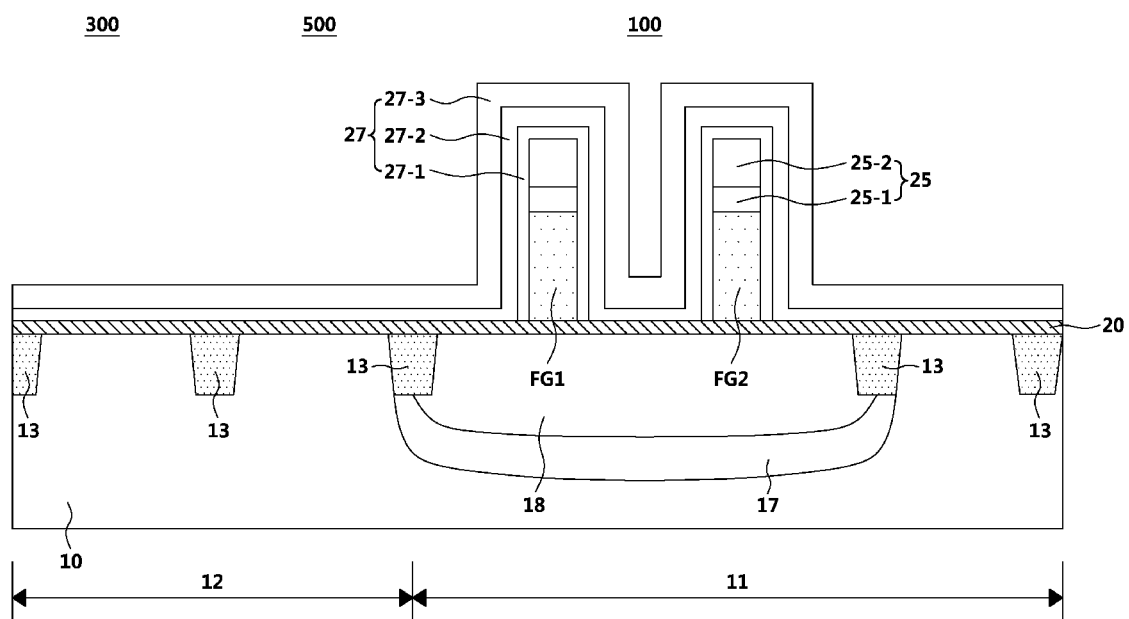

Referring to the example of FIG. 5A, a first silicon oxide layer 27-1, a second silicon nitride layer 27-2 and a third silicon oxide layer 27-3 may be sequentially deposited on the first and second floating gates FG1 and FG2 and the first hard mask pattern 25 in order to form a thick dielectric pattern 27. The first silicon oxide layer 27-1 may be formed by thermal oxidation at a high temperature, resulting in a thermal oxide being formed on sidewalls of the floating gates FG1 and FG2. The second silicon nitride film 27-2 and the third silicon oxide layer 27-3 may be formed by a LPCVD method.

Figure 5B:
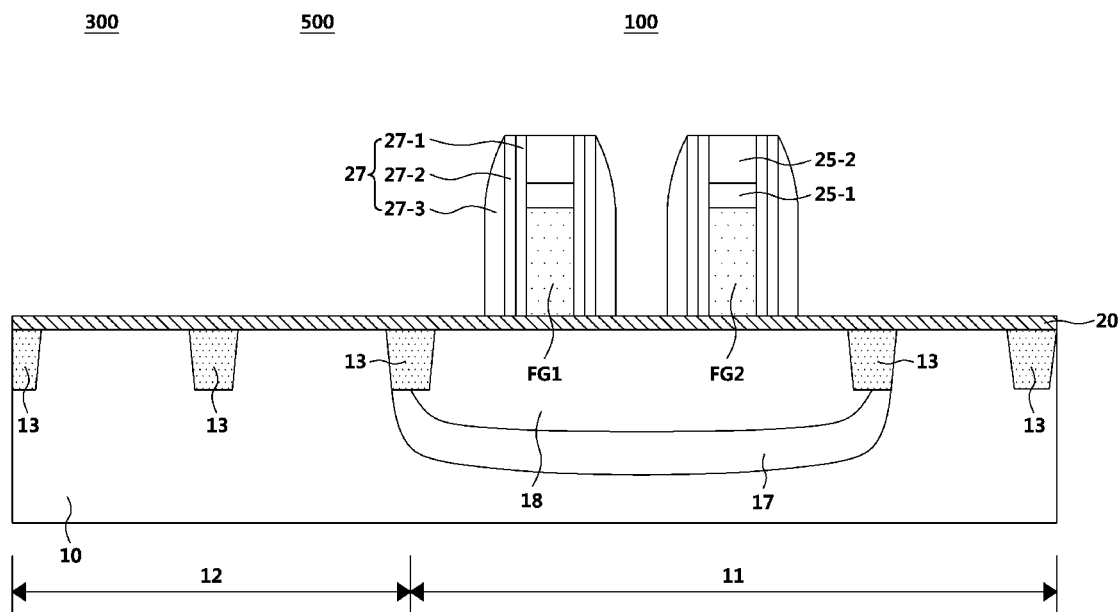

Referring to the example of FIG. 5B, an etch-back process may be performed with respect to the third silicon oxide layer 27-3, the second silicon nitride layer 27-2 and the first silicon oxide layer 27-1, resulting in ONO dielectric layer or thick dielectric pattern 27 being formed on each of the sidewalls of the floating gates FG1 and FG2. Therefore, the thick dielectric pattern 27 may be formed by patterning the first silicon oxide layer 27-1, the second silicon nitride layer 27-2 and the third silicon oxide layer 27-3. The thin oxide layer 20 located outside the thick dielectric pattern 27 and the floating gates FG1 and FG2 may be totally etched and may disappear after further subsequent processing.

FIGS. 6A to 8D illustrate a manufacturing process for forming a logic gate and a control gate in a semiconductor device according to an example.

Figure 6A:
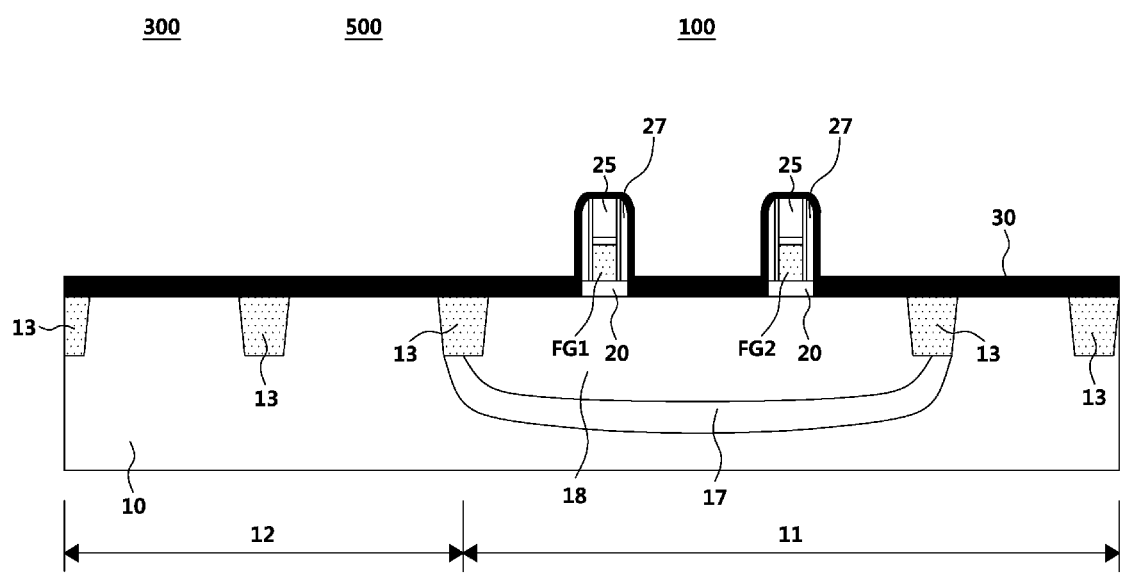
FIGS. 6A to 8D illustrate a manufacturing process for forming a logic gate and a control gate in a semiconductor device according to an example.

Referring to the example of FIG. 6A, a control gate insulator 30 may be formed on the semiconductor substrate and on the first and second floating gates FG1 and FG2 having the first hard mask pattern 25, and on the thick dielectric pattern 27. Such a control gate insulator 30 may be formed as any one of a silicon oxide film, a silicon nitride film, and a silicon oxy nitride film or a stack of such films, as non-limiting examples. The control gate insulator 30 may be used as a gate insulator for both the first and second control gates CG1 and CG2.

Figure 6B:
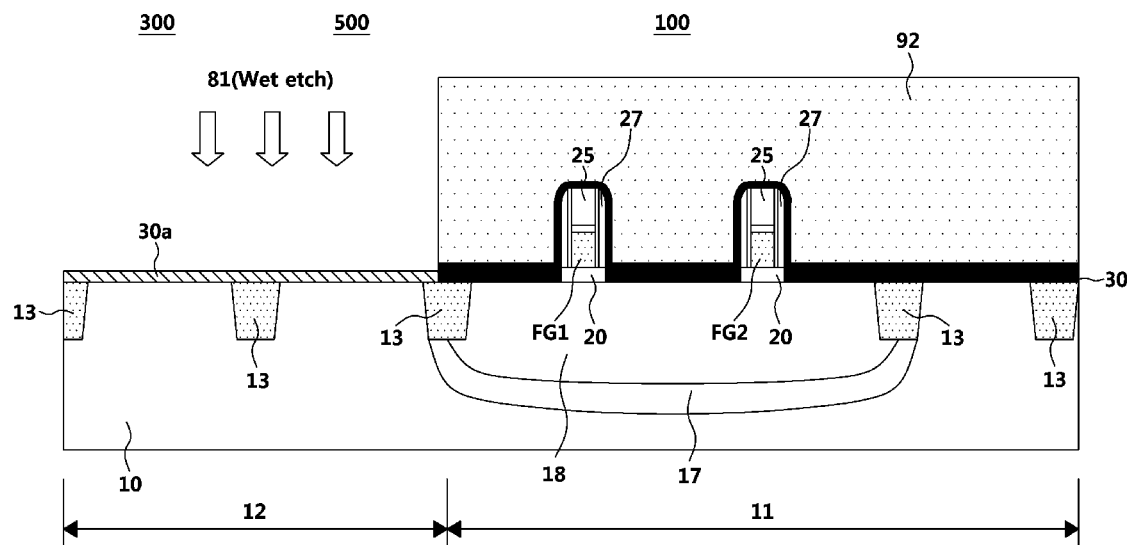

Referring to the example of FIG. 6B, a PR mask pattern 92 may be formed on the control gate insulator 30 and then wet etching process 81 may be performed to selectively remove the control gate insulator 30 in the logic region 12 by using the PR mask pattern 92 as a mask. In such an example, a thin oxide layer 30a may remain on the silicon substrate after the wet etching process. Then, the PR mask pattern 92 may be removed by a plasma ashing process.

Figure 6C:
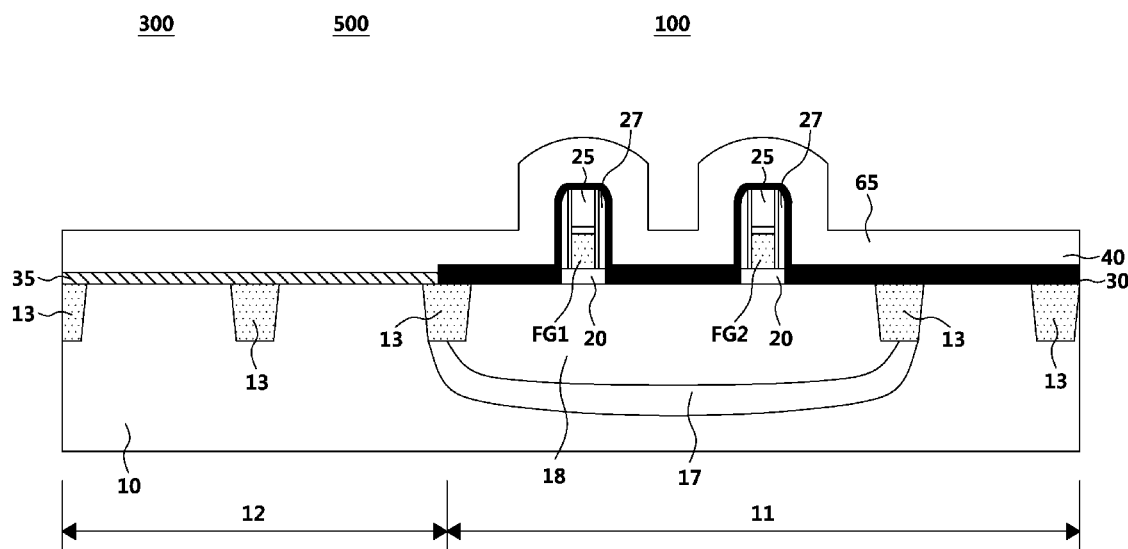

Referring to the example of FIG. 6C, the remaining thin oxide layer 30a in the example of FIG. 6B may be completely removed to form a thin gate insulator 35 on the substrate in the logic region. Such a thin gate insulator 35 may be selectively formed on the substrate in logic region 12 by using a thermal oxidation process. The thin gate insulator 35 may be used as a gate dielectric layer for logic devices 300 and 500. Subsequently, a second conductive film 40 may be deposited on the whole substrate. Thus, the second conductive film 41 may be formed on the control gate insulator 30 and the thin gate insulator 35. An upper portion and a sidewall of the first and second floating gates FG1 and FG2 may be additionally enclosed by the second conductive film 40. The second conductive film 40 may be used for the control gate CG and may be also formed using a single polysilicon layer or a stacked metal polysilicon layer in which a metal layer is laminated onto polysilicon. Such a second conductive film 40 may have a groove shape located between the first floating gate FG1 and the second floating gate FG2.

Referring to the example of FIG. 7A, a first protective film 65 may be deposited on the second conductive film 40, and a second protective film 71 may be subsequently deposited on the first protective film 65. The two protective films may be deposited to make a second hard mask pattern 70 that may be used for formation of logic gates, as shown in further detail in FIG. 7B. The first protective film 65 may include a silicon oxide film that is deposited using a tetraethyl orthosilicate (TEOS) material by an LPCVD method. The second protective film 71 may include a silicon nitride (SiN) film or a silicon oxynitride (SiON) film that has includes different material from the first protective film 65, so as to provide an etch selectivity. The first protective film 65 may be formed on the second conductive film 40 and may protect the second conductive film 40 in a subsequent etching process. The first protective film 65 and the second protective film 71 may also protect an upper portion of the first and second floating gates FG1 and FG2 in the subsequent etching process, and they may be removed in a final step.

Figure 7A:
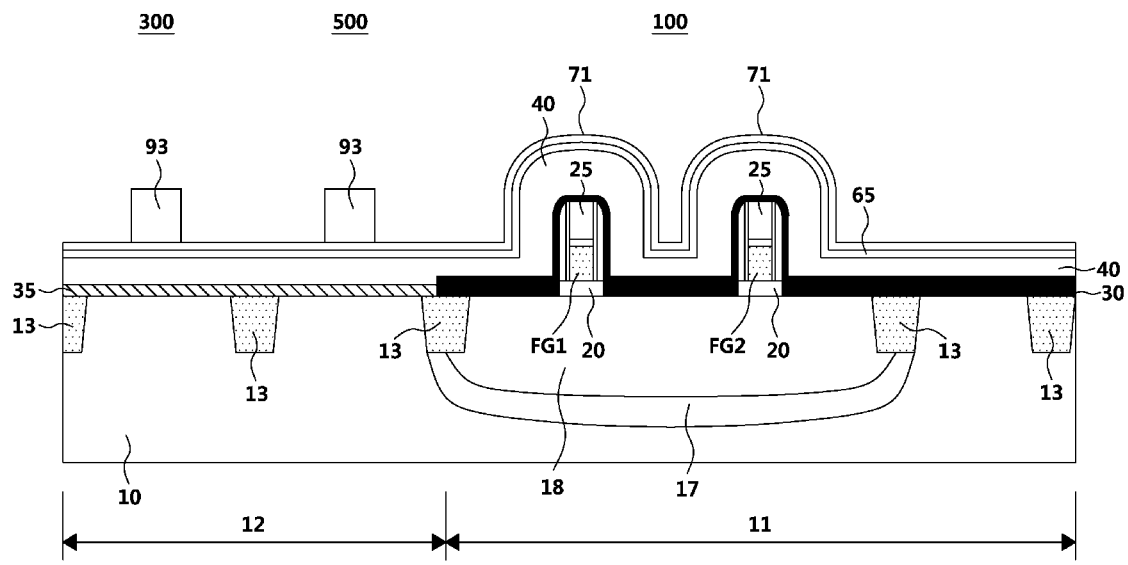

Referring to the example of FIG. 7A, a PR mask pattern 93 may be formed on the second protective film 71 in the logic region 12. For example, the PR mask pattern 93 may be formed in a part of the logic region 12 in order to create a second hard mask pattern 70. Also, the PR mask pattern 93 may not be formed in the cell region 11, as shown in the example of FIG. 7A.

Figure 7B:
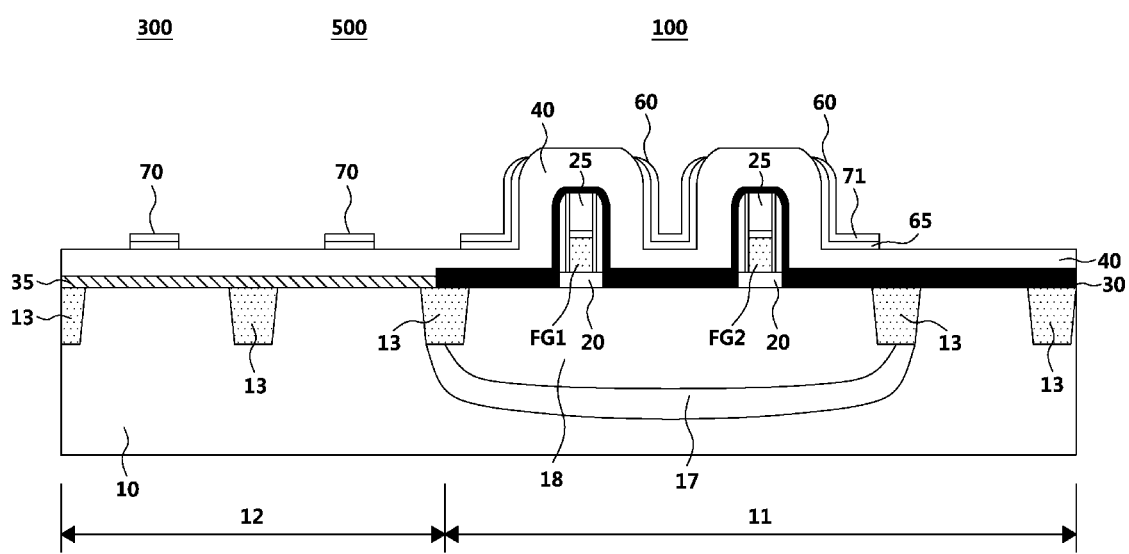

According to the example of FIG. 7B, a plasma etching process may be performed on the second protective film 71 and the first protective film 65 by using the PR mask pattern 93 to form a second hard mask pattern 70. In such an example, the second hard mask pattern 70 may be formed on the second conductive film 40 in the logic region 12. The second hard mask pattern 70 may also serve as a mask to form logic gates in a subsequent etching process.

According to the example of FIG. 7B, the second protective film 71 and the first protective film 65 may still remain as a spacer shape insulating layer 60 on sidewalls of the second conductive film 40 in the cell region 11 after the plasma etching process occurs. The spacer shape insulating layer 60 may also be formed on sidewalls of the second conductive film 40 in the cell region 11 after the plasma etching process occurs. The first protective film 65 and the second protective film 71 may be transformed into the spacer shape insulating layer 60. In such an example, there may be no PR mask pattern in the cell region 11. Thus an etch-back process may be performed in the cell region 11 during the plasma etching process, resulting in formation of the spacer shape insulating layer 60. After the plasma etching process occurs, an upper portion of the second conductive film 40 that overlaps with the first and second floating gates FG1 and FG2 may be exposed as shown in the example of FIG. 7B. If the second conductive film 40 is entirely removed, the first and second floating gates FG1 and FG2 may be protected by the first hard mask pattern 25 during the plasma etching process, because the first hard mask pattern 25 may still remain on the first and second floating gates FG1 and FG2, according to the present example.

Figure 8A:
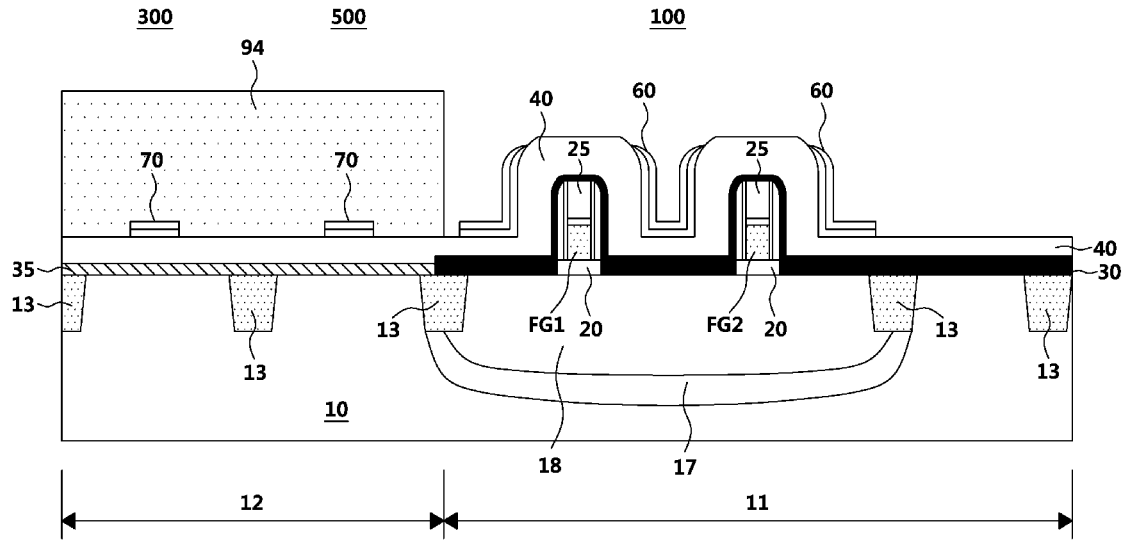

Referring to the example of FIG. 8A, a PR mask pattern 94 may be formed to cover the second hard mask pattern 70 as well as the second conductive film 40 in the logic region 12. However, the PR mask pattern 94 may not be formed in the cell region 11.

Figure 8B:
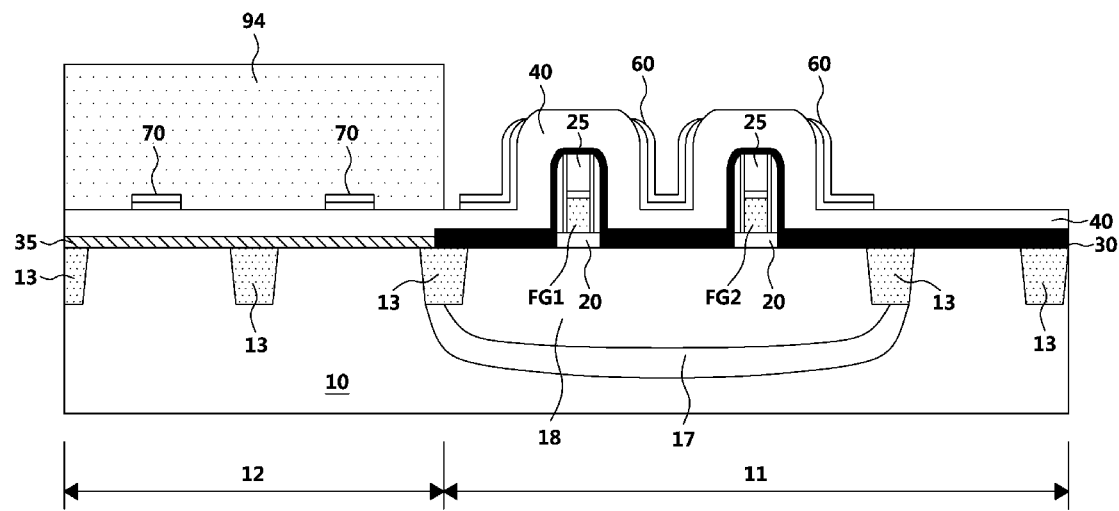

Referring to the example of FIG. 8B, a wet etching process 82 may be performed to remove the spacer shape insulating layer 60 formed on the sidewalls of the second conductive film 40 in the cell region 11. The wet etching process 82 may be performed using chemical etchants, such as a Buffered oxide etch (BOE) solution, as a non-limiting example. BOE, also known as buffered HF or BHF, is a wet etchant used in microfabrication. Its primary use is in etching thin films of silicon dioxide ($SiO_2$) or silicon nitride ($Si_3N_4$). BOE is a mixture of a buffering agents, such as ammonium fluoride ($NH_4F$), and hydrofluoric acid (HF), as non-limiting examples. Accordingly, the second sidewall spacer 60 may be removed by using the chemical etchants.

Figure 8C:
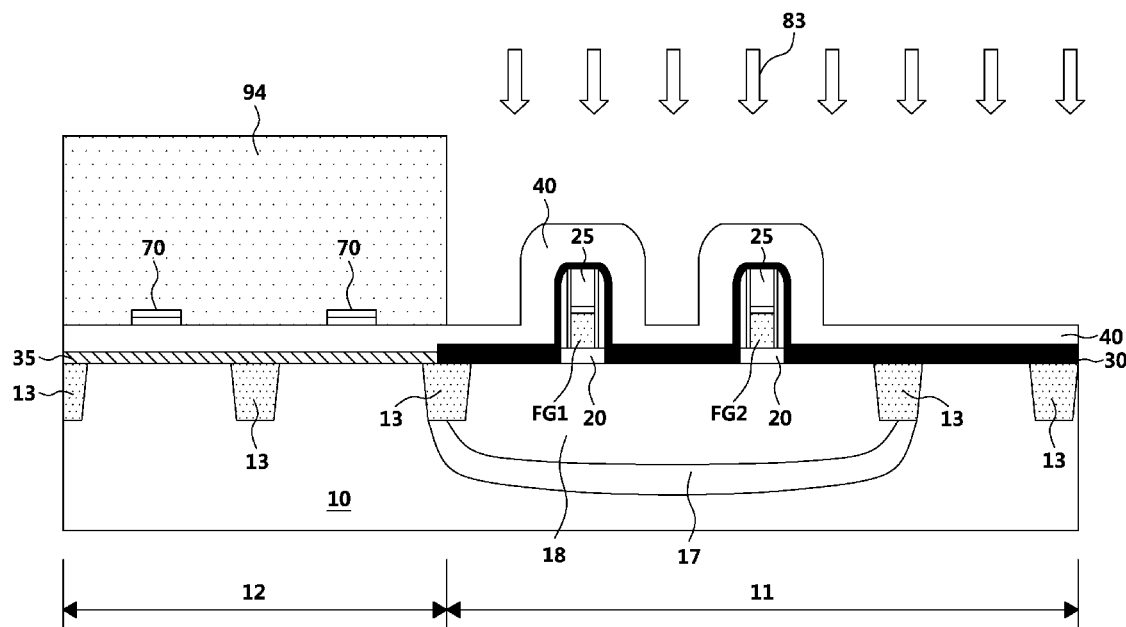

As illustrated in the example of FIG. 8C, after the wet etching process, an ion implantation 83 using N-type dopants into the second conductive film 40 may be performed. In order to ensure an erasable characteristic of the cell, the N-type dopants may be doped into the second conductive film 40 to cause the second conductive 40 to be transformed into being first and second control gates CG1 and CG2 in the cell region 11. The ion implantation process 83 may be performed on the second conductive film 40 using the PR mask pattern 94 that is the same PR mask pattern as that used for the wet etching process 82, thereby reducing a cost and shortening a processing time period.

After ion implantation processing, as described in further detail above, the PR mask pattern 94 may be removed using plasma ashing. Then, annealing process may be performed at a high temperature in order to activate the implanted N-type dopants distributed in the second conductive film 40.

Figure 8D:
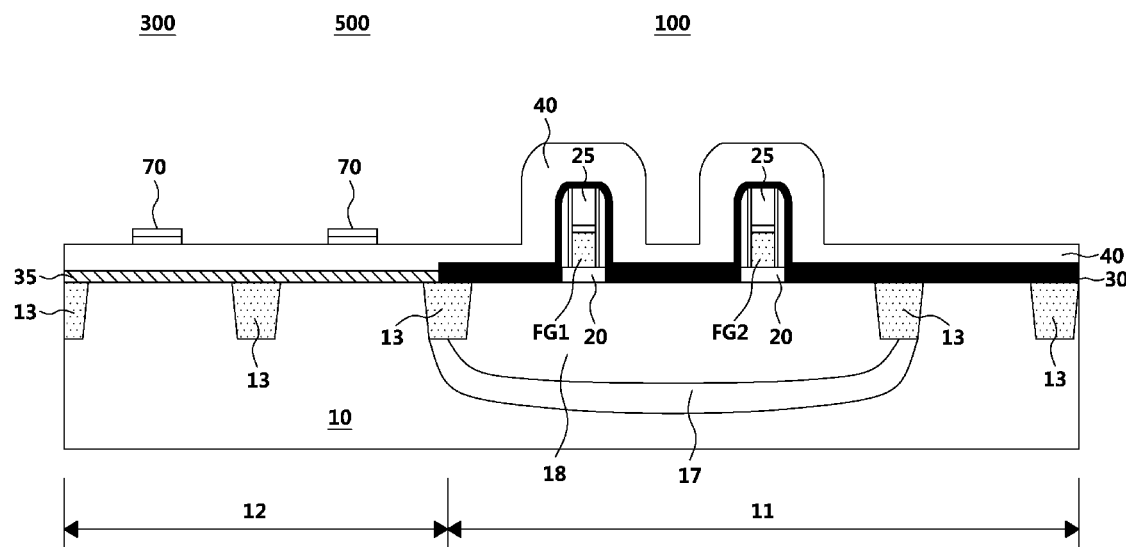

FIG. 8D illustrates a step of simultaneously forming the first and second control gates CG1 and CG2 and the logic gates LG1 and LG2 in the cell region 11 by using a plasma etching process.

Referring to the example of FIG. 8D, the plasma etching process may be performed on the second conductive film 40 without using a new PR mask pattern, that is, a blanket etching process or an etch-back process. Instead, the second hard mask pattern 70 as a mask may be used to form logic gates LG1 and LG2 in the logic region 12. In this manner, the logic gates LG1 and LG2 may be formed on the first logic gate insulator 301 in the logic region 12. The second hard mask pattern 70 may be consumed and disappears during the patterning of the second conductive film 40. Alternatively, the remaining second hard mask pattern 70 may be removed after patterning the second conductive film 40.

Figure 9:
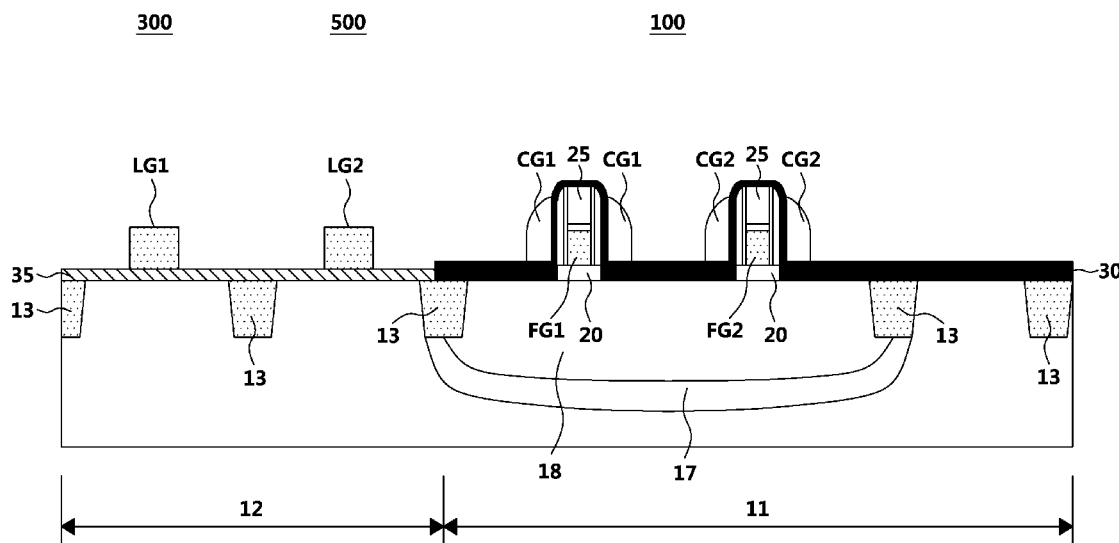
FIG. 9 illustrates a logic gate, floating gate and a control gate formed in a semiconductor device according to an example.

FIG. 9 illustrates a logic gate, floating gate and a control gate formed in a semiconductor device, according to an example.

As illustrated in the example of FIG. 9, the first and second control gates CG1 and CG2 are simultaneously formed on the sidewalls of the first and second floating gates FG1 and FG2 in the cell region 11, as well as the logic gates LG1 and LG2 formed in the logic region 12, after the third dry etching process. The plasma etching process may be an etch-back process. In such an example, the first and second control gates CG1 and CG2 may be formed on sidewall of the first and second floating gates FG1 and FG2 by the etch-back process, resulting in formation of a spacer shape including first and second control gates CG1 and CG2.

As illustrated in the example of FIG. 9, during the plasma etching process, the control gate insulator 30 formed on the first hard mask pattern 25 may be exposed because the second conductive film 40 formed on the control gate insulator 30 is removed in the cell region 11, in such an example. In a worst case, the second conductive film 40 may be wholly removed from a sidewall of the first and second floating gates FG1 and FG2 in the cell region 11 during the third dry etching process, because of a difference in etching rates between the second conductive film 40 and the second hard mask pattern 70. An over-etching of the second conductive film 40 in the cell region 11 may occur during the third dry etching process, although the second conductive film 40 in the logic region 12 may be protected by the second hard mask pattern 70. If a sufficient thickness of the hard mask pattern 25 is secured, a height of the second conductive film 40 formed over the hard mask pattern 25 may increase. In that example, side portions of the second conductive film 40 formed on sidewall of the first and second floating gates FG1 and FG2 may not be wholly removed in the cell region 11 during the third dry etching process, although a top portion of the second conductive film 40 formed on top surface of the first and second floating gates FG1 and FG2 may be wholly removed in the cell region 11. In that example, a height of the control gate CG1 and CG1 may be greater than a height of the first and second floating gates FG1 and FG2 with respect to a top surface of the substrate 10. Alternatively, a top surface of the first and second control gates CG1 and CG2 may be positioned higher than a top surface of the first and second floating gates FG1 and FG2. Therefore, in order to maintain a height of the control gate as being greater than a height of the first and second floating gates FG1 and FG2, a sufficient thickness of the first hard mask pattern 25 may be secured and accordingly desired electrical characteristics may be achieved.

Further, a thickness of the first hard mask pattern 25 of the present example of FIG. 3 may be similar to or smaller than the thickness of the first and second floating gates FG1 and FG2. Additionally, the thickness of the first hard mask pattern 25 of the present example of FIG. 3 may be the same as the thickness of the logic gates LG1 and LG2 of the logic region 12.

Depending on the thickness of the first hard mask pattern 25 in the present example, a top surface of the first and second control gates CG1 and CG2 may be positioned below a top surface of the first and second floating gates FG1 and FG2 due to the excessive etched quantity. In this example, coupling capacitances may vary between the first and second floating gates FG1 and FG2 and the control gate CG1 and CG2, which may adversely affect the program and the erasable characteristic of the cell.

In the present example of FIG. 9, a difference in etching rates may exist between the second conductive film 40 and the second hard mask pattern 70 and such a difference in etching rates may be used to simultaneously form the control gate CG1 and CG2 in the cell region 11 and the logic gate LG1 and LG2 in the logic region 12.

Further, in order to suppress the over-etching of the second conductive film 40 where the control gate is to be formed, the first hard mask pattern 25 above the first and second floating gates FG1 and FG2 may be formed to be thick, so that the thicknesses of the first and second control gates CG1 and CG2 may not be lower than the thickness of the first and second floating gates FG1 and FG2. That is, the thickness of the first and second floating gates FG1 and FG2 may be equal to or larger than the thickness of the first hard mask pattern 25. Thus, in such an example, the insulating layers may be formed between the first and second floating gates FG1 and FG2 and the first and second control gates CG1 and CG2. Also, a same conductive material such as a polysilicon layer may be used for the first and second floating gates FG1 and FG2 and the first and second control gates CG1 and CG2. According to the present example of FIG. 9, the control gate formed in the edge area of the memory device, for example, an EEPROM as a non-limiting example, does not have a protruding portion or a landing portion so that the size of the memory device may be reduced as a result. Further, the logic gates and the control gates may be formed as only having a reduced number of masks patterned, thus having a reduced number of processes as compared with the number of processes used in the first example. Further, the process steps may be reduced so that it may be expected to reduce the cost for manufacturing the nonvolatile memory device in the second example.

FIGS. 10 to 15 illustrate a manufacturing process for forming well regions, LDD regions, source/drain regions, and silicide layers in the logic device and the NVM device, according to an example.

Figure 10:
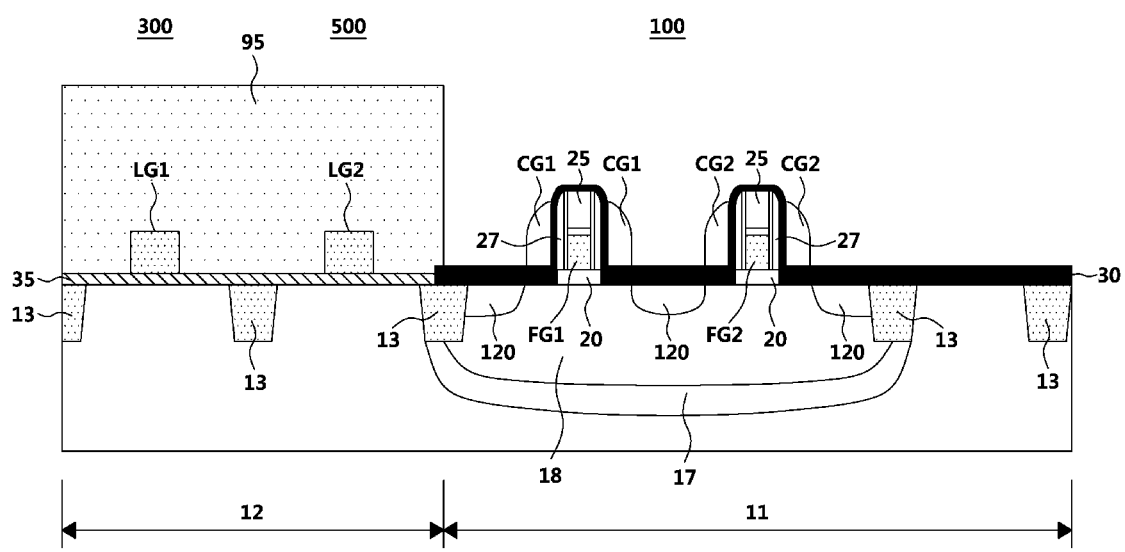

Referring to the example of FIG. 10, a PR mask pattern 95 may be formed to cover the logic region 12 and to open the cell region 11 to form N-type LDD (HNM) regions 120 in the P-type well (HPW) region 18. After forming the PR mask pattern 95, an ion implantation using N-type dopants may be performed into the P-type well (HPW) region 18. The N-type LDD (HNM) regions 120 may be aligned with respect to the first and second control gates CG1 and CG2. Then, the PR mask pattern 95 may be removed by a plasma ashing process.

Referring to the example of FIG. 11, a new PR mask pattern 96 may be formed to cover the cell region 11 and a part of the logic region 12, in order to form a first logic P-type well (PW) region 310 and N-type LDD (NM) regions 320. In such an example, the part of the logic region 12 covered by the PR mask pattern 96 may be an area which the PMOS transistor 500 is formed. The PR mask pattern 96 may open an area in which the NMOS transistor 300 is formed. After forming the PR mask pattern 96, a first ion implantation of P-type dopants having high implantation energy may be performed into the substrate 10 in order to form the first logic P-type well (PW) region 310 using the PR mask pattern 96. The dopants may pass through the first logic gate LG1 during the ion implantation process, so a depth profile of the first logic P-type well (PW) region 310 may not be coplanar.

Referring to the example of FIG. 11, a second ion implantation of N-type dopants having low implantation energy using the same PR mask pattern 96 as the first ion implantation may be further performed in order to form the N-type LDD (NM) regions 320. In such an example, the N-type LDD (NM) regions 320 may be aligned with respect to the first logic gate LG1. Then, the PR mask pattern 96 may be removed by a plasma ashing process.

A depth of the first logic PW region 310 below the first logic gate LG1 may be shallower than a depth of the first logic PW region 310 below the N-type LDD regions 320. Also, a depth of the first logic PW region 310 below the first gate electrode may be shallower than a depth of the first logic PW region 310 below the isolation region 13.

Referring to the example of FIG. 12, a PR mask pattern 97 may be formed to cover the cell region 11 and another part of the logic region 12 in order to form a second logic N-type well (NW) region 510 and P-type LDD (PM) regions 520. In such an example, another part of the logic region 12 covered by the PR mask pattern 97 may be an area which the NMOS transistor 300 is formed. The PR mask pattern 97 may open an area in which the PMOS transistor 500 is formed. After forming the PR mask pattern 97, a third ion implantation of N-type dopants having high implantation energy may be performed into the substrate 10 in order to form the second logic N-type well (NW) region 510 using the PR mask pattern 97. The dopants may pass through the second logic gate LG2 during the ion implantation, so a depth profile of the second logic N-type well (NW) region 510 may not be coplanar.

Referring to the example of FIG. 12, a fourth ion implantation of P-type dopants having low implantation energy using the same PR mask pattern 97 as the third ion implantation may be performed in order to form the P-type LDD (PM) regions 520. In such an example, the P-type LDD (PM) regions 520 may be aligned with respect to the second logic gate LG2. Then, the PR mask pattern 97 may be removed by a plasma ashing process.

A depth of the second logic NW region 510 below the second logic gate LG2 may be shallower than a depth of the second logic NW region 510 below the P-type LDD regions 520. A depth of the second logic NW region 510 below the second logic gate LG2 may be shallower than a depth of the second logic NW region 510 below the isolation region 13.

Figure 13:
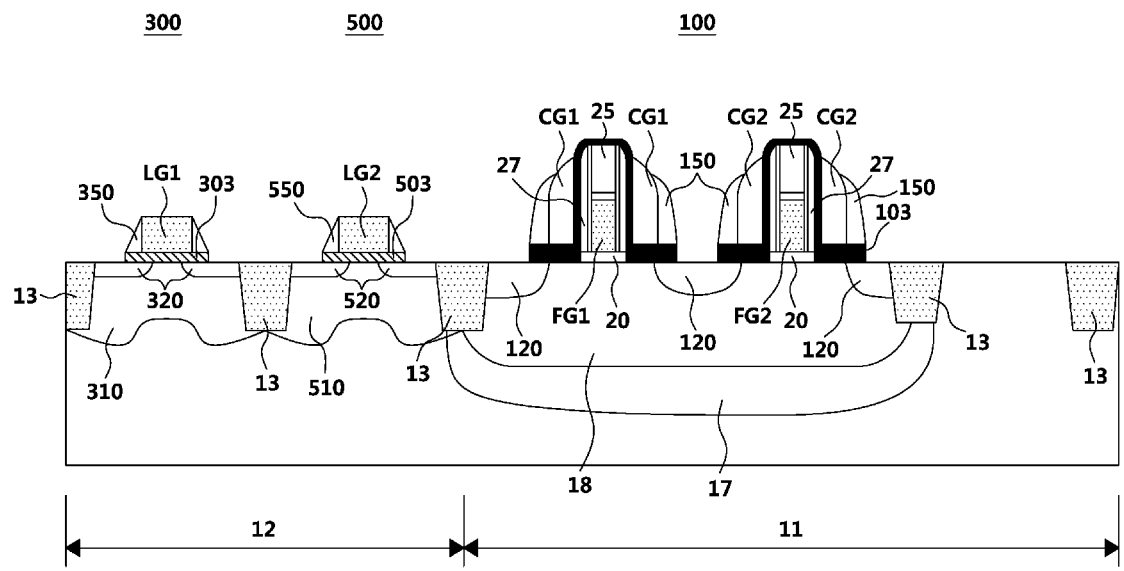

Referring to the example of FIG. 13, control gate spacers 150 may be formed on sidewalls of the control gates CG1 and CG2 in cell region 11. Further, first logic gate spacers 350 and second logic gate spacers 550 may also be formed on sidewalls of logic gates LG1 and LG2 in logic region 12. During the formation of the spacers 150, 350 and 550, the first logic gate insulator 301 and the control gate insulator 30 may be removed from outside of the logic gates LG1 and LG2 and the control gates CG1 and CG2.

Figure 14:
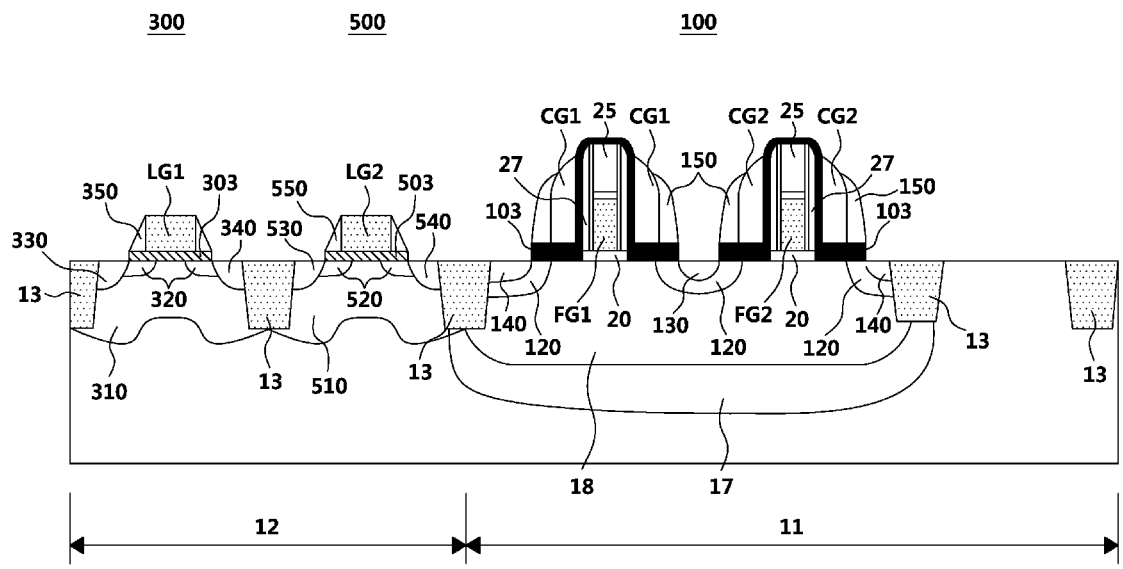

Referring to the example of FIG. 14, an N-type common source region 130 may be formed in one of the N-type LDD (HNM) regions 120 in the cell region 11, wherein the N-type common source region 130 may be disposed between the first floating gate FG1 and the second floating gate FG2. Further, two N-type drain regions 140 may be formed in the other two N-type LDD (HNM) regions 120, respectively. The N-type common source region 130 and two N-type drain regions 140 may be aligned with respect to the control gate spacers 150 formed on the sidewalls of the control gates CG1 and CG2.

Referring to the example of FIG. 14, a first logic N-type source region 330 and a first logic N-type drain region 340 may be formed in the in the first logic P-type well (PW) region 310 in the logic region 12. In a similar manner, a second logic P-type source region 530 and a second logic P-type drain region 540 may be formed in the in the second logic N-type well (NW) region 510 in the logic region 12. The logic source regions 340 and 530 and the logic drain regions 340 and 540 may be aligned with respect to the first logic gate spacers and second logic gate spacers 350, 550 formed on the sidewalls of the logic gates LG1 and LG2. The N-type common source region 130, the N-type common source region 130, the first logic N-type source region 330 and the first logic N-type drain region 340 may be formed simultaneously in the substrate 10.

Figure 15:
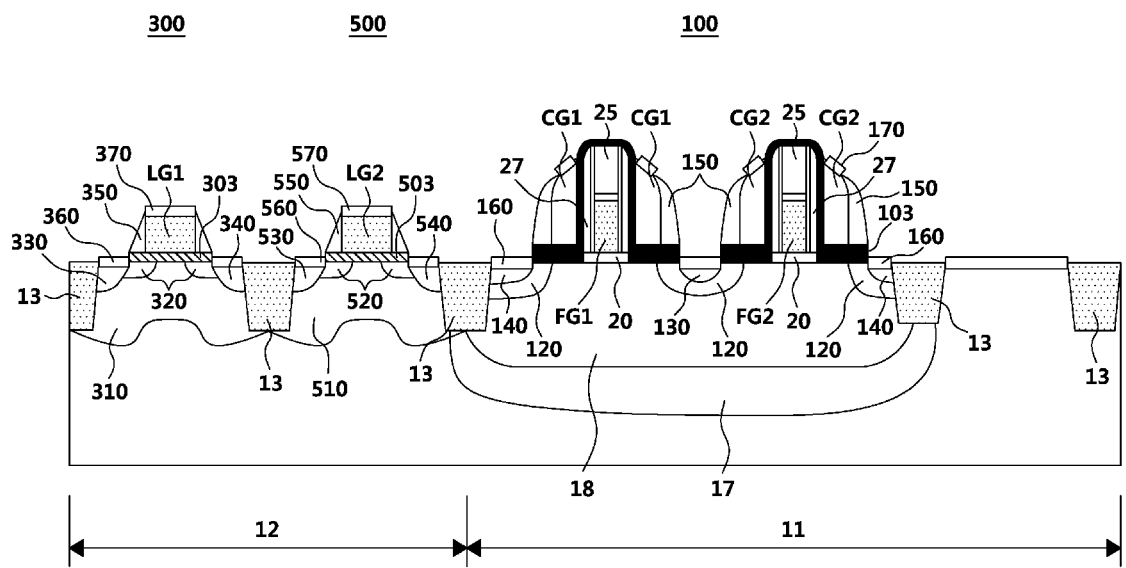

Referring to the example of FIG. 15, a salicide process may be performed in order to form silicide layers 160, 170, 360, 370, 560 and 570 formed on the exposed source/drain regions 130, 140, 330, 340, 530 and 540 and on the exposed logic gates LG1 and LG2 and on the exposed control gates CG1 and CG2. After the salicide process, a borderless contact (BLC) layer such as an $SiO_2$ or an SiON layer, as non-limiting examples, and inter-layer dielectric (ILD) layers such as phosposilicate glass (PSG), borophosphosilicate glass (BPSG), or tetraethyl orthosilicate (TEOS), and so on, as non-limiting examples, are sequentially formed on the entire semiconductor device 50A. Source/drain/gate contact plugs are formed after selectively etching the BLC layer and ILD layers to contact the silicide layers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A manufacturing method of a semiconductor device, the method comprising:
   providing a cell region and a logic region on a substrate;
   forming a gate stack comprising a first hard mask pattern and having a first height on the cell region;
   forming a control gate insulating layer on the cell region and the gate stack;
   forming a logic gate insulating layer on the logic region;
   forming a conductive film on the control gate insulating layer and the logic gate insulating layer, the conductive film comprising a first portion and a second portion overlapping the control gate insulating layer and the logic gate insulating layer, respectively;

forming a second hard mask pattern on the second portion of the conductive film;

performing an etch-back process on the conductive film using the first and second hard mask patterns to simultaneously form a spacer-shaped control gate in the cell region and a logic gate in the logic region;

forming a first source region and a first drain region on both sides of the control gate electrode, respectively; and forming a second source region and a second drain region on both sides of the logic gate electrode, respectively.

2. The method of claim 1, wherein the gate stack comprises:
a tunneling gate insulator formed on the substrate;
a floating gate formed on the tunneling gate insulator;
the first hard mask pattern formed on the floating gate; and
a thick dielectric pattern formed on sidewalls of the floating gate,
wherein the control gate electrode is disposed on the thick dielectric pattern.

3. The method of claim 1, wherein the control gate formed by performing the etch-back process is disposed on sidewalls of the gate stack, and has a second height lower than the first height of the gate stack.

4. The method of claim 2, wherein the control gate is formed to enclose the floating gate.

5. The method of claim 1, further comprising:
forming a first photoresist mask pattern on the control gate insulating layer; and
performing an etching process to selectively remove the control gate insulating layer using the first photoresist mask pattern as a mask,
wherein a first portion of the control gate insulating layer remains on the cell region, and a second portion of the control gate insulating layer does not remain on the logic region.

6. The method of claim 1, wherein the forming of the second hard mask pattern on the second portion of the conductive film comprises:
forming a hard mask insulating film on the conductive film;
forming a first photoresist mask pattern on the hard mask insulating film disposed in the logic region;
performing an etching process on the hard mask insulating film using the first photoresist mask pattern to form the second hard mask pattern on the second portion of the conductive film;
forming a second photoresist mask pattern covering the second hard mask pattern; and
removing the hard mask insulating film remaining in the cell region using the second photoresist mask pattern.

7. The method of claim 6, wherein the hard mask insulating film comprises:
a first protection film having a first material; and
a second protection film having a second material different from the first material.

8. A manufacturing method of a semiconductor device, the method comprising:
providing a cell region and a logic region on a substrate;
forming a gate stack comprising a first hard mask and having a first height on the cell region;

forming a control gate insulating layer on the cell region and the gate stack;

forming a logic gate insulating layer on the logic region;

forming a conductive film on the control gate insulating layer and the logic gate insulating layer;

forming a second hard mask pattern on the conductive film disposed on the logic region;

performing an etch-back process on the conductive film using the first and second hard mask patterns to simultaneously form a spacer-shaped control gate disposed on sidewalls of the gate stack in the cell region and a vertical-shaped logic gate disposed on the logic gate insulating layer in the logic region;

forming a first source region and a first drain region on both sides of the spacer-shaped control gate, respectively; and forming a second source region and a second drain region on both sides of the vertical-shaped logic gate, respectively.

9. The method of claim 8, wherein the spacer-shaped control gate is formed to enclose a floating gate.

10. The method of claim 8, wherein the gate stack comprises:
a tunneling gate insulator formed on the substrate;
a floating gate formed on the tunneling gate insulator;
the first hard mask pattern formed on the floating gate; and
a thick dielectric pattern formed on the sidewalls of the floating gate.

11. The method of claim 8, wherein the spacer-shaped control gate formed by performing the etch-back process is disposed on the sidewalls of the gate stack, and has a second height lower than the first height of the gate stack.

12. The method of claim 8, wherein the conductive film comprises a first portion and a second portion overlapping the control gate insulating layer and the logic gate insulating layer, respectively.

13. The method of claim 12, wherein the second hard mask pattern is disposed on the second portion of the conductive film disposed on the logic region.

14. The method of claim 8, wherein the forming of the second hard mask pattern on the conductive film comprises:
forming a hard mask insulating film on the conductive film;
forming a first photoresist mask pattern on the hard mask insulating film disposed in the logic region;
performing an etching process on the hard mask insulating film using the first photoresist mask pattern to form the second hard mask pattern on the second portion of the conductive film;
forming a second photoresist mask pattern covering the second hard mask pattern; and
removing the hard mask insulating film remaining in the cell region using the second photoresist mask pattern.

15. The method of claim 14, wherein the hard mask insulating film comprises:
a first protection film having a first material; and
a second protection film having a second material different from the first material.

* * * * *